(12) United States Patent
Eom

(10) Patent No.: US 11,306,879 B2
(45) Date of Patent: Apr. 19, 2022

(54) LIGHTING MODULE AND LIGHTING DEVICE COMPRISING SAME

(71) Applicant: LG INNOTEK CO., LTD., Seoul (KR)

(72) Inventor: Dong Il Eom, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/253,711

(22) PCT Filed: Jun. 4, 2019

(86) PCT No.: PCT/KR2019/006724
§ 371 (c)(1),
(2) Date: Dec. 18, 2020

(87) PCT Pub. No.: WO2019/245195
PCT Pub. Date: Dec. 26, 2019

(65) Prior Publication Data
US 2021/0262621 A1    Aug. 26, 2021

(30) Foreign Application Priority Data

Jun. 20, 2018 (KR) .......................... 10-2018-0070537

(51) Int. Cl.
*F21Y 115/10* (2016.01)
*F21K 9/68* (2016.01)
(Continued)

(52) U.S. Cl.
CPC .................. *F21K 9/68* (2016.08); *F21K 9/69* (2016.08); *F21S 41/337* (2018.01); *F21Y 2115/10* (2016.08)

(58) Field of Classification Search
CPC ............................ G02B 6/0038; G02B 6/0016
See application file for complete search history.

(56) References Cited

U.S. PATENT DOCUMENTS 6,097,549 A * 8/2000 Jenkins ................. F21S 43/239
359/726
6,653,765 B1 * 11/2003 Levinson .............. H01L 33/507
257/E33.074
(Continued)

FOREIGN PATENT DOCUMENTS

CN          102487063 A       6/2012
JP          2005-353875       12/2005
(Continued)

OTHER PUBLICATIONS

International Search Report dated Sep. 10, 2019 issued in Application No. PCT/KR2019/006724.
(Continued)

*Primary Examiner* — Jong-Suk (James) Lee
*Assistant Examiner* — Eric T Eide
(74) *Attorney, Agent, or Firm* — Ked & Associates LLP

(57) ABSTRACT

A lighting module disclosed in the embodiment of the invention includes a substrate; a plurality of light emitting devices disposed on the substrate; a resin layer disposed on the substrate and the light emitting device; a phosphor layer disposed on the resin layer; and a recess portion overlapping the light emitting device in a vertical direction, wherein an upper surface area of the recess portion includes a range of 50% to 150% of an upper surface area of the light emitting device, and the recess portion is formed to be concave toward the upper surface of the resin layer from the light emitting device and may include an inclined side surface lower than the upper surface of the resin layer.

20 Claims, 16 Drawing Sheets

(51) Int. Cl.
*F21K 9/69* (2016.01)
*F21S 41/33* (2018.01)

(56) References Cited

U.S. PATENT DOCUMENTS

| | | | | |
|---|---|---|---|---|
| 7,942,546 | B2 | 5/2011 | Naijo et al. | |
| 9,333,905 | B2 | 5/2016 | Nomura et al. | |
| 2007/0201234 | A1* | 8/2007 | Ottermann | G02B 6/0038 362/341 |
| 2011/0249214 | A1* | 10/2011 | Cheong | G02B 6/002 349/61 |
| 2012/0069575 | A1* | 3/2012 | Koh | G02B 6/0036 362/296.01 |
| 2015/0048395 | A1 | 2/2015 | Vampola et al. | |
| 2016/0131817 | A1* | 5/2016 | Wakui | G02B 5/0231 362/618 |
| 2017/0097448 | A1* | 4/2017 | Wang | G02B 5/0278 |
| 2017/0261161 | A1 | 9/2017 | Moon et al. | |
| 2019/0137046 | A1* | 5/2019 | Hwang | F21V 7/22 |
| 2019/0324184 | A1* | 10/2019 | Cai | G02B 6/0068 |

FOREIGN PATENT DOCUMENTS

| | | |
|---|---|---|
| KR | 10-2008-0083017 | 9/2008 |
| KR | 10-2012-0040549 | 4/2012 |
| KR | 10-2012-0046454 | 5/2012 |
| KR | 10-2014-0095723 | 8/2014 |
| KR | 10-2016-0083839 | 7/2016 |
| KR | 10-1646663 | 8/2016 |
| KR | 10-1729266 | 4/2017 |

OTHER PUBLICATIONS

European Search Report dated Feb. 16, 2022 issued in Application 19823667.1.

\* cited by examiner

LIGHTING MODULE AND LIGHTING DEVICE COMPRISING SAME

CROSS-REFERENCE TO RELATED PATENT APPLICATIONS

This application is a U.S. National Stage Application under 35 U.S.C. § 371 of PCT Application No. PCT/KR2019/006724, filed Jun. 4, 2019, which claims priority to Korean Patent Application No. 10-2018-0070537, filed Jun. 20, 2018, whose entire disclosures are hereby incorporated by reference.

TECHNICAL FIELD

An embodiment of the invention relates to a lighting module having a light emitting device. An embodiment of the invention relates to a lighting module that provides a surface light source. An embodiment of the invention relates to a light unit or a vehicle lamp having a lighting module.

BACKGROUND ART

Typical lighting applications include vehicle lights as well as backlights for displays and signs. Light emitting devices, for example, light emitting diodes (LEDs) have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since the emission angle of light emitted from the light emitting diode is small, when the light emitting diode is used as a vehicle lamp, there is a demand for increasing the light emitting area of the lamp using the light emitting diode. Light emitting diodes can increase the design freedom of lamps because of their small size, and are economical due to their semi-permanent lifetime.

DISCLOSURE

Technical Problem

An embodiment of the invention provides a lighting module that provides a surface light source. An embodiment of the invention may provide a lighting module in which a plurality of light emitting devices and a recess portion for reflecting or diffusing light are disposed on each of the light emitting devices. An embodiment of the invention may provide a lighting module having a recess portion recessed in the direction of the resin layer between a resin layer covering a light emitting device and a phosphor layer. An embodiment of the invention may provide a flexible lighting module having a plurality of light emitting devices, a resin layer, and a phosphor layer on a substrate. An embodiment of the invention provides a lighting module with improved light extraction efficiency and light distribution characteristics. An embodiment of the invention provides a lighting module for irradiating a surface light source and a lighting device having the same. An embodiment of the invention may provide a light unit having a lighting module, a liquid crystal display device, or a vehicle lamp.

Technical Solution

A lighting module according to an embodiment of the invention includes a substrate; a plurality of light emitting devices disposed on the substrate; a resin layer disposed on the substrate and the light emitting devices; a phosphor layer disposed on the resin layer; and a recess portion overlapping the light emitting device in a vertical direction, wherein an area of an upper surface of the recess portion includes a range of 50% to 150% of an area of an upper surface of the light emitting device, and the recess portion may be formed to be concave in the direction of the light emitting device on the upper surface of the resin layer and may include an inclined side surface lower than the upper surface of the resin layer.

According to an embodiment of the invention, a shortest distance between the recess portion and the light emitting device may include a range of 3 to 5 times a thickness of the light emitting device. An angle formed by a side surface of the recess portion and a horizontal upper surface of the resin layer may range from 30 degrees to 50 degrees. The recess portion may have an inverted cone or an inverted polygonal pyramid shape. The recess portion may be filled with air or may include a material having a refractive index of 1. The recess portion includes a vertex that is a lowermost point of the inclined side surface, and an inner angle formed by one side and the other side of the recess portion may range from 80 degrees to 120 degrees based on the vertex. The phosphor layer may include a red phosphor, and at least one of the resin layer and the phosphor layer may include a diffusion agent. An edge of an upper surface of the recess portion and an edge of an upper surface of the light emitting device may extend in the same direction. It may include a light shielding portion or a phosphor portion disposed between the light emitting device and the resin layer. A reflective member is disposed between the substrate and the resin layer and is disposed around the light emitting device, and a height of the reflective member may decrease from a center region toward an edge thereof. A lighting device according to an embodiment of the invention may include one or a plurality of the lighting modules.

Advantageous Effects

According to an embodiment of the invention, in the lighting module, the light uniformity of the surface light source may be improved. In the lighting module, a conical recess portion is provided on each light emitting device in an empty space, so that incident light may be reflected or diffused. In the lighting module, hot spots on each light emitting device may be reduced. In addition, by stacking layers of resin material on the light emitting device, a flexible lighting module may be implemented. The light efficiency and light distribution characteristics of the lighting module may be improved. The optical reliability of the lighting module and the lighting device having the same may be improved. The reliability of the vehicle lighting device having the lighting module may be improved. Embodiments of the invention may be applied to a backlight unit having a lighting module, various display devices, surface light source lighting devices, or vehicle lamps.

BEST MODE

Figure 1:
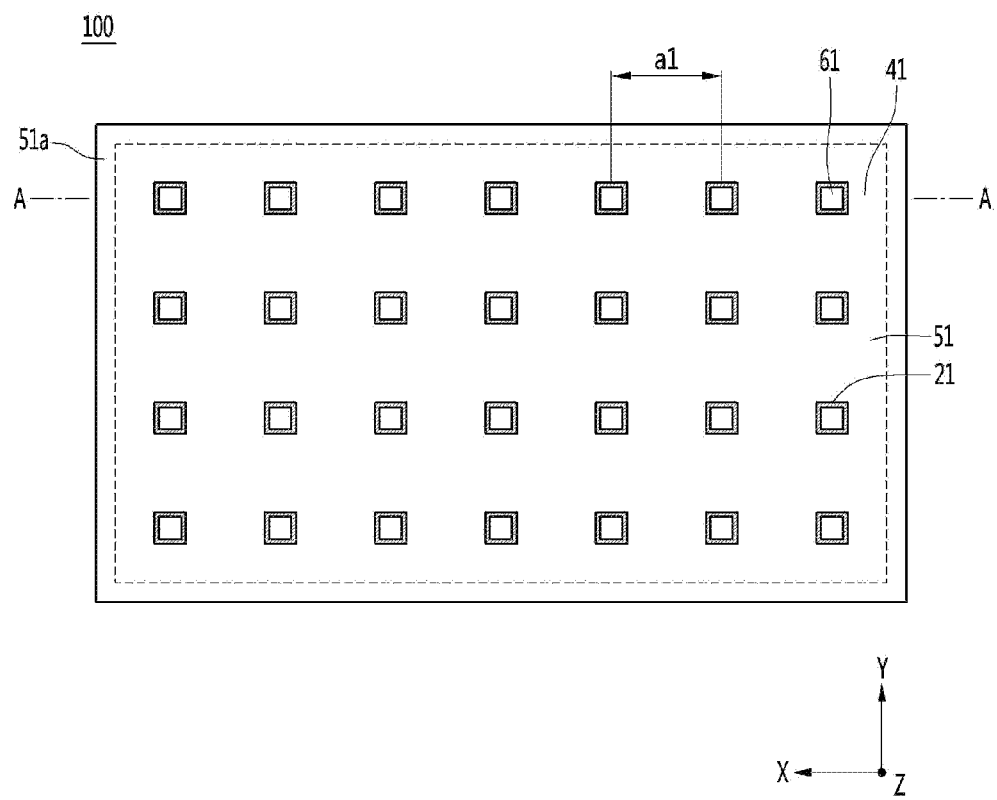
FIG. 1 is a plan view showing a lighting module according to an embodiment of the invention.

Hereinafter, preferred embodiments of the invention will be described in detail with reference to the accompanying drawings, in which a person having ordinary skill in the art to which the invention pertains may easily implement the invention. However, it should be understood that embodiments described in the specification and configurations illustrated in the drawings are merely a preferred embodiment of the invention, and there are various equivalents and modifications that may substitute the embodiments and configurations at the time of filing the present application.

In describing operating principles of a preferred embodiment of the invention in detail, when detailed description of a known function or configuration is deemed to unnecessarily blur the gist of the present disclosure, the detailed description will be omitted. Terms to be described below are defined as terms defined in consideration of functions of the invention and meaning of each term should be interpreted based on the contents throughout the specification. The same reference numerals are used for parts having similar functions and actions throughout the drawings.

A lighting device according to the invention may be applied to various lamp devices requiring lighting, for example, a vehicle lamp, a home lighting device, or an industrial lighting device. For example, when a lighting device is applied to a vehicle lamp, it may be applied to a head lamp, a side mirror lamp, a fog lamp, a tail lamp, a stop lamp, a side marker lamp, a daytime running light, a vehicle interior lighting, a door scarf, rear combination lamps, a backup lamp, and the like. The lighting device of the invention may also be applied to indoor and outdoor advertisement apparatus fields, and also may be applicable to all other lighting-related fields and advertisement-related fields that are currently being developed and commercialized or that may be implemented by technological development in the future.

Hereinafter, embodiments will be shown more apparent through the description of the appended drawings and embodiments. In the description of the embodiments, in the case in which each layer (film), area, pad or pattern is described as being formed "on" or "under" each layer (film), area, pad or pattern, the "on" and "under" include both of forming "directly" and "indirectly". Also, the reference for determining "on" or "under" each layer will be described based on the figures.

<Lighting Module>

Figure 2:
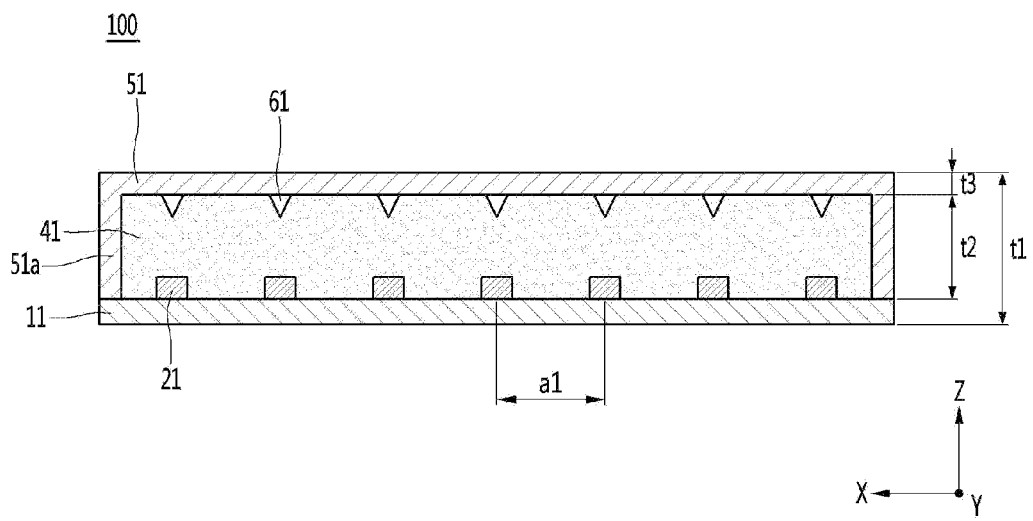
FIG. 2 is a cross-sectional view of A-A side of the lighting module of FIG. 1.
Figure 3:
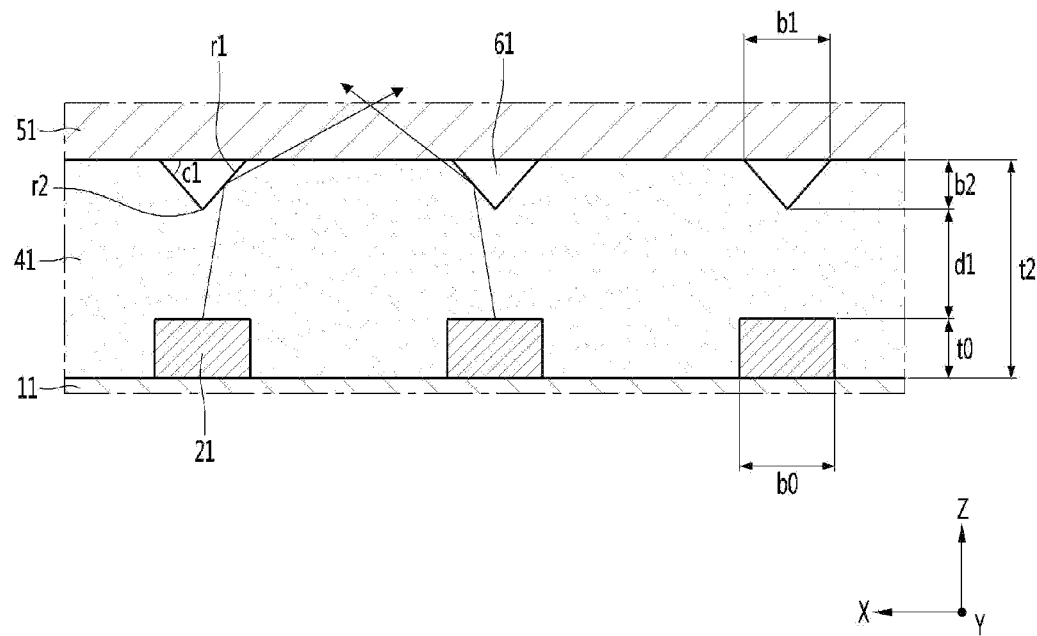
FIG. 3 is a partially enlarged view of the lighting module of FIG. 2.
Figure 4:
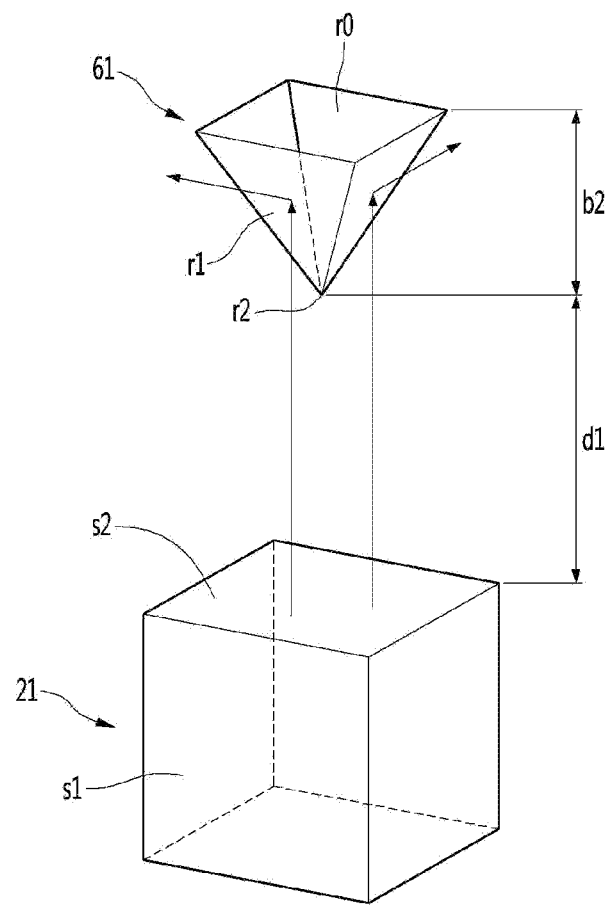
FIG. 4 is a perspective view showing an arrangement example of the light emitting device and the recess portion of FIG. 3.
Figure 5:
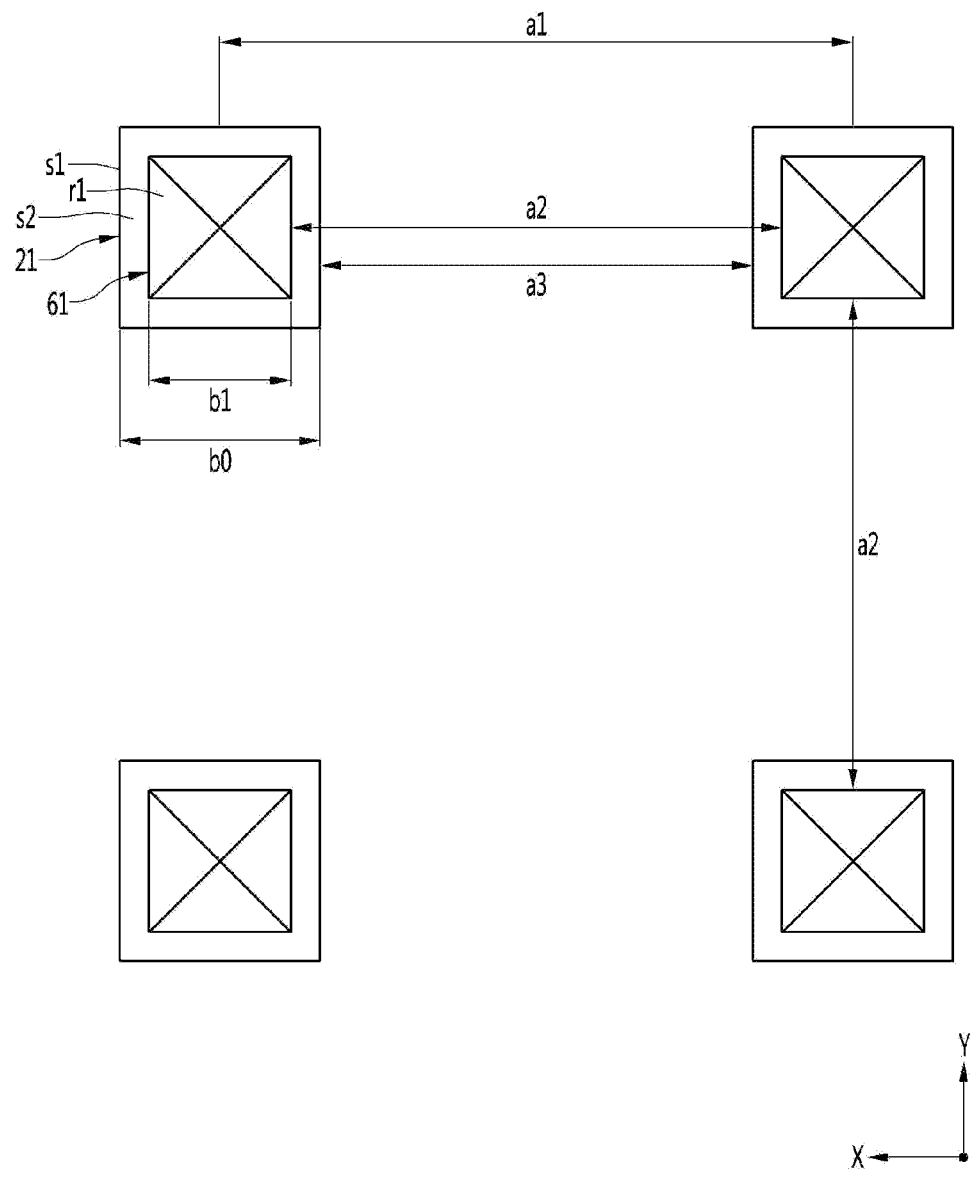
FIG. 5 is a diagram for explaining an arrangement example of a light emitting device and a recess portion in FIG. 1.

FIG. 1 is a plan view showing a lighting module according to an embodiment of the invention, FIG. 2 is an example of a cross-sectional view of a A-A side of the lighting module of FIG. 1, FIG. 3 is a partially enlarged view of the lighting module of FIG. 2, and FIG. 4 is a perspective view illustrating an arrangement example of the light emitting device and the recess portion, and FIG. 5 is a diagram illustrating an arrangement example of the light emitting device and the recess portion in FIG. 1.

FIGS. 1 to 5, the lighting module 100 may include a substrate 11, a light emitting device 21 disposed on the substrate 11, and a resin layer 41 covers the light emitting device 21 on the substrate 11. It may include a recess portion 61 overlapping the light emitting device 21 in a vertical direction. The lighting module 100 may include a phosphor layer 51 on the resin layer 41. The lighting module 100 may emit light emitted from the light emitting device 21 to a surface light source. The lighting module 100 may be a rigid module or a flexible module.

As shown in FIG. 1, in the lighting module 100, a plurality of light emitting devices 21 may be arranged as N in a first direction X (N is an integer of 2 or more) and M in a second direction (M is an integer of 1 or more). The plurality of light emitting devices 21 may be arranged in a line shape or a matrix shape having N×M. The lighting module 100 may be applied to various lamp devices that require lighting, such as vehicle lamps, home lighting devices, and industrial lighting devices. For example, in the case of lighting modules applied to vehicle lamps, head lamps, vehicle position lamps, side mirror lamps, fog lamps, tail lamps, turn signal lamps, back up lamps, and stop lamps, daytime running right, vehicle interior lighting, door scarf, rear combination lamp, and backup lamp, etc. The lighting module 100 may be provided as a flexible module in the form of being assembled to a bracket having an inclined or curved surface or a housing. The lighting module 100 may emit at least one of green, blue, yellow, white, or red light. For example, the lighting module 100 may emit at least one of red light and yellow light.

The substrate 11 includes a printed circuit board (PCB), for example, a resin-based printed circuit board (PCB), a metal core PCB, a flexible PCB, and a ceramic PCB, and FR-4 substrate. The substrate 11 may include, for example, a flexible PCB. The upper surface of the substrate 11 has an X axis-Y axis plane, and the thickness of the substrate 11 may be a height in the Z direction orthogonal to the X and Y directions. Here, the X direction may be a first direction, the Y direction may be a second direction orthogonal to the X direction, and the Z direction may be a third direction orthogonal to the X direction and the Y direction. The length of the substrate 11 in the X direction and the length in the Y direction may be the same or different from each other. The thickness of the substrate 11 may be 0.5 mm or less, for example, in the range of 0.3 mm to 0.5 mm. Since the thickness of the substrate 11 is provided to be thin, the thickness of the lighting module may not be increased. The thickness t1 of the lighting module 100 may be 5 mm or less from the bottom of the substrate 11, for example, 3 mm to 5 mm or 3 mm to 4.5 mm. The thickness t1 of the lighting module 100 may be a linear distance between the lower surface of the substrate 11 and the upper surface of the phosphor layer 51. The thickness t1 of the lighting module 100 may be 200% or less of the thickness t2 of the resin layer 41, for example, in the range of 150% to 200%.

The substrate 11 may include a wiring layer (not shown) thereon, and the wiring layer may be electrically connected to the light emitting device 21. The plurality of light emitting devices 21 may be connected in series, parallel, or in series-parallel by a wiring layer of the substrate 11. The substrate 11 may function as a base member or a support member positioned under the light emitting device 21 and the resin layer 41. When the thickness t1 of the lighting module 100 is thinner than the above range, the light diffusion space may be reduced and a hot spot may occur, and when it is greater than the thickness range, spatial installation restrictions and design freedom may be reduced due to the module thickness. An embodiment of the invention may have a thin thickness t1 of the lighting module 100, for example, 5 mm or less or 4 mm or less, and provide a uniform luminance distribution.

The substrate 11 may be provided with a connector in a portion to supply power to the light emitting devices 21. A region on the substrate 11 in which the connector is disposed may be a region in which a resin layer is not formed. A top view shape of the substrate 11 may have a rectangular shape, a square shape, or another polygonal shape. The substrate 11 may be a bar shape having a long linear shape or a curved shape in one direction. The substrate 11 may include a protective layer or a reflective layer thereon. The protective layer or the reflective layer may include a member having a solder resist material, and the solder resist material is a white material, and may reflect incident light.

The light emitting device 21 is disposed on the substrate 11 and may be sealed with the resin layer 41. The light emitting device 21 emits light through the resin layer 41. The resin layer 41 may be in contact with the surface of the light emitting device 21. As shown in FIG. 4, each of the light emitting devices 21 has a plurality of side surfaces s1 and an upper surface s2, and the upper surface s2 may face the upper surface of the resin layer 41. The light emitting device 21 may emit light through the plurality of side surfaces s1. The plurality of side surfaces s1 and the upper surface s2 of the light emitting device 21 are emitted light through the resin layer 41. When the phosphor layer 51 is disposed on the resin layer 41, light traveling through the resin layer 41 may be wavelength-converted through the phosphor layer 51 and then emitted. The light emitting device 21 is an LED chip that emits light on at least five surfaces, and may be disposed on the substrate 11 in a flip chip form. As another example, the light emitting device 21 may include a horizontal type LED chip or a vertical type LED chip. When the light emitting device 21 is a horizontal chip or a vertical chip, the chip is connected to another chip or a wiring pattern with a wire, and the thickness of the resin layer may increase due to the height of the wire. In addition, since a connection space according to the length of the wire is required, the interval between the light emitting devices 21 may be increased. As another example, the light emitting device 21 may be provided as a package having an LED chip.

The light emitting device 21 may be formed to have a thickness t0 (FIG. 3) of 0.3 mm or less. In the light emitting device 21 according to the embodiment of the invention, a distribution of the orientation angle may be increased due to the five-sided light emission. The pitch a1 between the light emitting devices 21 may be equal to or greater than the thickness t2 (t2=a1) of the resin layer 41, for example, 2.5 mm or more, and may vary according to the LED chip size. It may be seen that the light emitting device 21 disclosed in the embodiment of the invention is provided as an LED chip that emits light on at least five surfaces, thereby further improving luminance distribution and a distribution of the orientation angle. When the light emitting devices 21 are arranged in an N×M matrix on the substrate 11, the N may be 1 or 2 or more, and the M may be 2 or more. The light emitting devices 21 may be arranged in a first direction X and a second direction Y, respectively.

The light emitting device 21 is a light emitting diode (LED) chip and may emit at least one of blue, red, green, ultraviolet (UV) and infrared rays. The light emitting device 21 may emit at least one of, for example, blue, red, and green light. The light emitting device 21 may be electrically connected to the substrate 11. The light emitting device 21 may emit blue light, for example, in a range of 420 nm to 470 nm. The plurality of light emitting devices 21 may emit light of the same wavelength or different wavelengths. The different wavelengths may emit light in a range of 420 nm to 470 nm and a range of 619 nm to 710 nm, for example. The light emitting device 21 may be sealed with a transparent insulating layer or a layer of a resin material on the surface. The light emitting device 21 may have a phosphor layer having a phosphor on a surface thereof. The light emitting device 21 may have a support member having a ceramic support member or a metal plate disposed under it, and the support member may be used as an electric conduction and heat conduction member.

The resin layer 41 may be disposed on the substrate 11. The resin layer 41 seals the light emitting device 21 on the substrate 11. The resin layer 41 may be adhered to the upper surface of the substrate 11. The resin layer 41 may be adhered to the upper surface of the substrate 11 with an adhesive or may be directly adhered. For example, the resin layer 41 may be formed on the substrate 11 by a transfer molding method.

A plurality of layers is stacked on the light emitting device 21 according to an embodiment of the invention, and the plurality of layers may include, for example, two or more layers or three or more layers. The plurality of layers may optionally include at least two or more three or more layers of a layer having no impurities, a layer to which a phosphor is added, a layer having a diffusion agent, and a layer to which a phosphor/diffuser is added. At least one of the plurality of layers may selectively include a diffusion agent and a phosphor. That is, the phosphor and the diffusion agent may be disposed in separate layers from each other, or may be mixed with each other and disposed in one layer. The impurity may be a phosphor and a diffusion agent. The layers provided with the phosphor and the diffusion agent may be disposed adjacent to each other or may be disposed spaced apart from each other. When the layer with the phosphor and the layer with the diffusion agent are separated from each other, the layer on which the phosphor is disposed may be disposed above the layer on which the diffusion agent is disposed. The phosphor may include at least one of a blue phosphor, a green phosphor, a red phosphor, and a yellow phosphor. The size of the phosphor may range from 1 μm to 100 μm. The higher the density of the phosphor, the higher the wavelength conversion efficiency may be, but since the luminous intensity may be lowered, it may be added in consideration of the light efficiency within the above size. The diffusion agent may include at least one of PMMA (Poly Methyl Meth Acrylate) series, $TiO_2$, $SiO_2$, $Al_2O_3$, and silicon series. The diffusion agent may have a refractive index in the range of 1.4 to 2 at the emission wavelength, and its size may be in the range of 1 μm to 100 μm. The diffusion agent may have a spherical shape, but is not limited thereto. The plurality of layers may include a resin material. The plurality of layers may have the same refractive index, at least two layers have the same refractive index, or a layer adjacent to the uppermost layer may gradually decrease the refractive index.

As shown in FIGS. 2 and 3, the resin layer 41 may have a thickness t2 that is thicker than the thickness t0 of the light emitting device 21. The thickness t2 of the resin layer 41 may be thicker than the thickness of the substrate 11, and may be 3 times or more than the thickness of the substrate 11, for example, in a range of 3 to 8 times. Since the resin layer 41 is disposed at the thickness t2, it is possible to seal the light emitting device 21 on the substrate 11, prevent moisture penetration, and support the substrate 11. The resin layer 41 and the substrate 11 may be formed of a flexible plate. The thickness t2 of the resin layer 41 may be less than 5 mm, for example, in the range of 3 mm to 4.9 mm or in the range of 2.5 mm to 4 mm. The thickness t2 of the resin layer 41 may be thicker than the thickness t3 of the phosphor layer 51 and may be thicker than the thickness of the substrate 11. The thickness t2 of the resin layer 41 may be less than 5 mm, for example, 4 mm or less, and may be thicker than the sum of the thickness t3 of the phosphor layer 51 and the thickness of the substrate 11.

The resin layer 41 may be a transparent resin material, for example, a resin material such as UV (Ultra violet) resin, silicone, or epoxy. The resin layer 41 may be a transparent resin material, for example, a resin material such as UV (Ultra violet) resin, epoxy, or silicone. The refractive index of the resin layer 41 may be 1.8 or less, for example, 1.1 to 1.8 or 1.4 to 1.6, and may be lower than the refractive index of the diffusion agent. The UV resin may be, for example, a resin (oligomer type) containing a urethane acrylate oligomer as a main material. For example, it is possible to use a synthetic oligomer urethane acrylate oligomer. The main material may further include a monomer in which isobornyl acrylate (IBOA), hydroxybutyl acrylate (HBA), and hydroxy metaethyl acrylate (HEMA), which are low boiling point diluent type reactive monomers, are mixed, and as an additive, a photoinitiator (for example, 1-hydroxycyclohexyl phenyl-ketone, Diphenyl), Diphenyl (2,4,6-trimethylbenzoyl phosphine oxide), an antioxidant or the like may be mixed. The UV resin may be formed of a composition including 10 to 21% of an oligomer, 30 to 63% of a monomer, and 1.5 to 6% of an additive. In this case, the monomer may be a mixture of 10 to 21% of isobornyl acrylate (IBOA), 10 to 21% of hydroxybutyl acrylate (HBA), and 10 to 21% of hydroxy metaethyl acrylate (HEMA). The additive may be added in an amount of 1 to 5% of a photo initiator to be able to perform a function of initiating photo reactivity, and may be formed of a mixture capable of improving yellowing by adding 0.5 to 1% of an antioxidant. The formation of the resin layer using the above-described composition may form a layer with a resin such as UV resin instead of a light guide plate to adjust the refractive index and the thickness, and simultaneously, may satisfy all of adhesive characteristics, reliability and a mass production rate by using the above-described composition.

The phosphor layer 51 may be disposed on the resin layer 41. The phosphor layer 51 may be disposed on the upper surface of the resin layer 41. A side portion 51a of the phosphor layer 51 may be disposed on an outer side of the resin layer 41. The side portions 51a of the phosphor layer 51 may be disposed on all sides of the resin layer 41. The side portion 51a of the phosphor layer 51 may be adhered to the upper surface of the substrate 11. The side portion 51a of the phosphor layer 51 extends to the outer side of the resin layer 41 and contacts the upper surface of the substrate 11, so that moisture penetration may be prevented. The side portion 51a of the phosphor layer 51 may emit wavelength-converted light. The phosphor layer 51 may include the same phosphor or different phosphors in an upper region disposed on an upper surface of the resin layer 41 and a region of the side portion 51a. For example, a first phosphor may be added to the upper region, and a second phosphor may be added to the side portion 51a. The first phosphor is a red phosphor, and the second phosphor may include at least one of red, green, yellow, and blue. The phosphor layer 51 may be a material different from or the same material as the resin material of the resin layer 41. The phosphor layer 51 may include a transparent resin material, and may include a phosphor therein. The phosphor layer 51 may include one or more types of phosphors, for example, at least one of a red phosphor, a green phosphor, a blue phosphor, and a yellow phosphor. The phosphor layer 51 may include a red phosphor, or a red phosphor and red ink. The phosphor layer 51 may convert a wavelength of incident light by including a phosphor therein. Here, when the light emitted from the light emitting device 21 is the first light and the light converted from the phosphor layer 51 is the second light, the second light may have a longer wavelength than the first light. The second light on the lighting module 100 may be higher than the luminous intensity of the first light. This is because the phosphor layer 51 converts most of the light into wavelength, so that the luminous intensity of the second light converted through the phosphor layer 51 may be higher than the luminous intensity of the first light. When turned on or off of the light, the surface color of the phosphor layer 51 may be a red color or a color close to red. When turned on or off of the light, the surface color of the phosphor layer 51 may be a color close to that of the phosphor. When turned off of the light, the surface color of the phosphor layer 51 may be the same as the color of the ink added in the phosphor layer 51.

The phosphor layer 51 may include a material such as silicon or epoxy. The phosphor layer 51 may have a refractive index in the range of 1.45 to 1.6. The phosphor layer 51 may have a refractive index equal to or higher than that of a diffusion agent. The phosphor layer 51 may be higher than the refractive index of the resin layer 41. When the refractive index of the phosphor layer 51 is lower than the above range, the uniformity of light may be lowered, and when it is higher than the above range, the light transmittance may decrease. Accordingly, the refractive index of the phosphor layer 51 is provided in the above range, so that the light transmittance and the light uniformity may be adjusted. Since the phosphor layer 51 has a phosphor therein, it may be defined as a layer that diffuses light. The content of the phosphor may be added in the same amount or ratio as the resin material forming the phosphor layer 51. In the phosphor layer 51, a ratio of a resin material and a phosphor may be mixed in a ratio of, for example, 4:6 to 6:4. The phosphor may range from 40 wt % to 60 wt % in the phosphor layer 51. The content of the phosphor may have a difference of 20% or less or 10% or less with respect to the resin material of the phosphor layer 51. In an embodiment of the invention, by adding the phosphor content to the phosphor layer 51 at a ratio of 40% or more and 60% or less, the color on the surface of the phosphor layer 51 may be provided as the color of the phosphor and the light diffusion and wavelength conversion efficiency may be improved. In addition, transmission of the wavelength of light emitted from the light emitting device 21 through the phosphor layer 51, for example, the transmission of blue light may be reduced. In addition, the light extracted through the phosphor layer 51 may be provided as a surface light source according to the wavelength of the phosphor.

The phosphor layer 51 may be provided in the form of a film by, for example, adding a phosphor in a silicone material and then curing it. The phosphor layer 51 may be formed directly on the resin layer 41 or may be separately formed and then adhered. The phosphor layer 51 manufactured in the form of a film may be adhered to the upper surface of the resin layer 41. An adhesive may be disposed between the phosphor layer 51 and the resin layer 41. The adhesive is a transparent material, and may be an adhesive such as UV adhesive, silicone or epoxy. Since the phosphor layer 51 is provided in the form of a film, it is possible to provide a uniform distribution of the phosphor inside, and the color sense of the surface color may be provided at a certain level or higher.

By using a film made of a resin material for the phosphor layer 51, a module having high ductility may be provided compared to the case of using a polyester (PET) film. The phosphor layer 51 may be a protective film having a phosphor or a release film having a phosphor. The phosphor layer 51 may be provided as a film attachable or detachable from the resin layer 41.

The phosphor layer 51 may have a thickness t3 (t3<t2) smaller than the thickness (t2) of the resin layer 41. The phosphor layer 51 may have a thickness of 0.5 mm or less, for example, in the range of 0.3 mm to 0.5 mm. The thickness t3 of the phosphor layer 51 may be 25% or less of the thickness t2 of the resin layer 41. The thickness t3 of the phosphor layer 51 may be 18% or less of the thickness t2 of the resin layer 41, for example, in a range of 15% to 25%. When the thickness t3 of the phosphor layer 51 is thicker than the above range, the light extraction efficiency by the phosphor layer 51 may decrease or the module thickness may increase. When it is smaller than the above range, it may be difficult to suppress the hot spots or the wavelength conversion efficiency may be lowered. In addition, the phosphor layer 51 is a layer for wavelength conversion and external protection, and when it is thicker than the above range, the ductility characteristics of the module may be deteriorated, and design freedom may be lowered. The phosphor converts the light emitted from the light emitting device 21 to wavelength. When the phosphor is a red phosphor, it is converted into red light. The resin layer 41 uniformly reflects or diffuses light by the recess portion 61 so that most of the light emitted from the light emitting device 21 may be converted to wavelength, and the light diffused through the resin layer 41 may be wavelength converted by the phosphor.

Since the phosphor layer 51 includes a phosphor, an external color may be seen as the color of the phosphor. For example, when the phosphor is red, the surface color may be seen as red, so when the light emitting device 21 is turned off, a red image may be provided, and when the light emitting device 21 is turned off, a predetermined red light having a luminous intensity may be diffused and may be provide a red image of a surface light source. As another example, a layer having the same color as the phosphor or a deeper color sense may be further disposed on the surface of the phosphor layer 51. That is, when a red phosphor is added, a red ink layer may be formed on the surface. The lighting module 100 according to the embodiment may have a thickness of 5 mm or less, emit a surface light source through a surface, and may have flexible characteristics. The lighting module 100 may emit light through an upper surface and a side surface, and when the lighting module is combined with a housing, the side light may be guided upward or reflected again.

As shown in FIGS. 2 and 3, the lighting module 100 may include a recess portion 61. The recess portion 61 may be disposed on the resin layer 41. The resin layer 41 according to an embodiment of the invention may include a recess portion 61 thereon. The recess portions 61 may overlap each of the light emitting devices 21 in a vertical direction. The recess portion 61 and the light emitting device 21 may correspond to one-to-one (1:1). The recess portion 61 may diffuse light emitted through the upper surface of the light emitting device 21 on the light emitting device 21 in a lateral direction. The recess portion 61 may be disposed on the resin layer 41 to reflect or diffuse incident light. Accordingly, the resin layer 41 having the recess portion 61 may prevent hot spots in a region overlapping the light emitting device 21 in a vertical direction. Accordingly, the lighting module 100 may provide a uniform luminance distribution without adding a diffusion agent inside the resin layer 41.

When the above-described recess portion 61 is not in the resin layer 41, the following problems occur. In order to suppress hot spots on the resin layer, a diffusion agent is added to the inside of the resin layer, and thus, the light intensity due to the diffusion agent may be reduced. In order to prevent hot spots on the resin layer, the thickness of the resin layer having a diffusion agent is formed to be thicker, for example, 5 mm or more, so that the module thickness is increased. Alternatively, when a layer having a diffusion agent is further added on the resin layer, it may cause an increase in the manufacturing process or module thickness. There is a limit to widening the interval between light emitting devices in the resin layer. The embodiment of the invention reduces the amount of the diffusion agent and adds to the diffusion agent to at least one of the phosphor layer 61 and the resin layer 41, thereby improving the surface light source more.

In an embodiment of the invention, the recess portion 61 of the resin layer 41 suppresses hot spots or dark portions by allowing the light emitting devices 21 to overlap in a vertical direction and spaced apart from the light emitting devices 21 at predetermined intervals. The resin layer 41 may have a thickness of less than 5 mm, for example, less than 4 mm.

Therefore, the lighting module 100 may be provided as a lighting lamp such as an OLED or a lighting lamp of the same size as a micro LED. In addition, light may be diffused in the lateral direction by the recess portion 61, thereby increasing the interval between the light emitting devices 21.

As shown in FIGS. 2 and 3, the recess portions 61 are respectively disposed on the light emitting device 21 and may be disposed between the resin layer 41 and the phosphor layer 51. The recess portion 61 may be recessed from the upper surface of the resin layer 41 toward the light emitting device 21. The recess portion 61 may include an air space, and the air space may be provided in an air or vacuum state. The refractive index of the space provided by the recess portion 61 may be 1.2 or less or 1. The recess portion 61 is made of air, and may include at least one of oxygen, nitrogen, or argon gas.

The upper surface of the recess portion 61 may face the lower surface of the phosphor layer 51. The side surface r1 of the recess portion 61 may be a boundary surface with the resin layer 41 or a circumferential surface or a side surface of the recess region. The side surface r1 of the recess portion 61 may be formed by the resin layer 41. The side surface r1 of the recess portion 61 may be disposed lower than an upper surface of the resin layer 41. The side surface r1 of the recess portion 61 may be provided as a reflective surface. The side surface r1 of the recess portion 61 may be provided as a surface inclined with respect to a horizontal straight line. The side surface r1 of the recess portion 61 may be provided as a surface inclined with respect to a horizontal lower surface of the phosphor layer 51. The angle c1 formed between the side surface r1 of the recess portion 61 and the upper surface of the resin layer may be 50 degrees or less, and may be in the range of 30 degrees to 50 degrees. The recess portion 61 may include a vertex r2 that is the lowest point of the inclined side surface r1. An inner angle formed by one side and the other side of the recess portion 61 based on the vertex r2 may range from 80 degrees to 120 degrees. When the angle c1 and the inner angle are smaller than the above range, light extraction efficiency may decrease or a dark portion may occur. When the angle c1 and the inner angle are smaller than the above range, light reflection efficiency may decrease and a hot spot suppression region may be small.

The upper surface region of the recess portion 61 may be 50% or more of the upper surface area of the light emitting device 21 or may range from 50% to 150% of the upper surface area of the light emitting device 21. When the upper surface area of the recess portion 61 is smaller than the above range, the hot spot suppression effect is insignificant, and when the upper surface area is larger than the above range, a dark portion may occur. The upper surface width b1 of the recess portion 61 may be 50% or more or in a range of 50% to 150% of the upper surface width b0 of the light emitting device 21. The upper surface width b1 of the recess portion 61 may be smaller or larger than the upper surface width b0 of the light emitting device 21. When the upper surface area of the recess portion 61 is less than 100%, the recess portion 61 may be disposed in a region facing the upper surface of the light emitting device 21.

The depth b2 or height of the recess portion 61 may be smaller than the distance d1 or the shortest distance between the light emitting device 21 and the recess portion 61. The distance d1 or the shortest distance between the light emitting device 21 and the recess portion 61 may range from 3 to 5 times the thickness t0 of the light emitting device 21. When the distance d1 or the shortest distance is smaller than the above range, a dark portion may be generated, and when it is larger than the above range, hot spot control may become difficult. The depth b2 or height of the recess portion 61 may vary depending on the inclination angle c1 and the size of the light emitting device 21. The recess portion 61 may have a horn shape. The recess portion 61 may have an inverted polygonal horn shape or an inverted circular cone shape. The recess portion 61 may have an inverted truncated cone shape.

The recess portion 61 may be gradually closer to the light emitting device 21 toward the center or the vertex r2. At this time, since the recess portion 61 has an inner angle of the vertex r2 in the range of 80 to 120 degrees, light transmitted to the vertex r2 facing the light emitting device 21 may be minimized and the amount of light extracted through the side surface r1 connected to the vertex r2 or disposed around the upper circumference thereof may be increased. These recess portions 61 may reflect incident light in a lateral direction.

Figure 7:
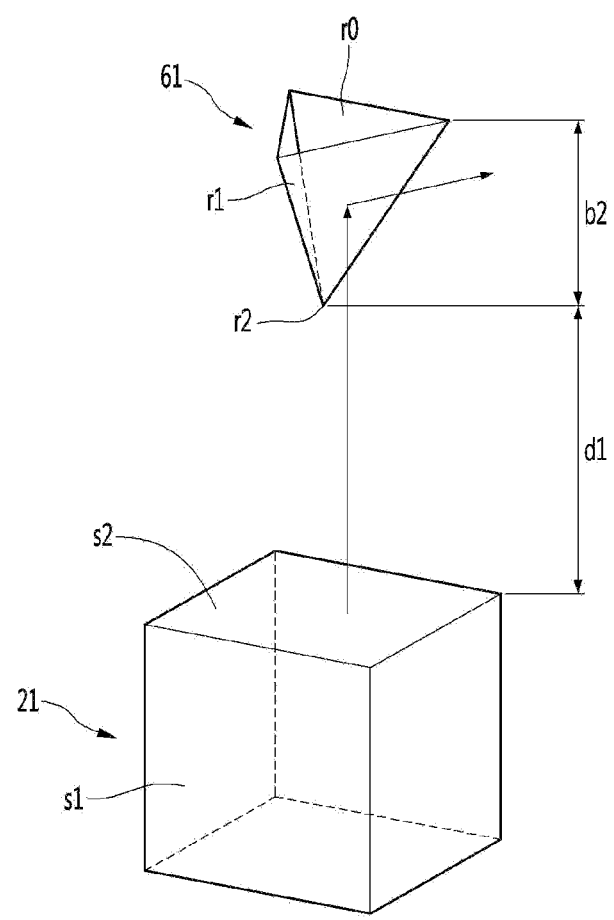
FIGS. 7 to 9 are diagrams for explaining a relationship with a light emitting device according to a shape change of a recess portion in a lighting module according to an embodiment of the invention.
Figure 8:
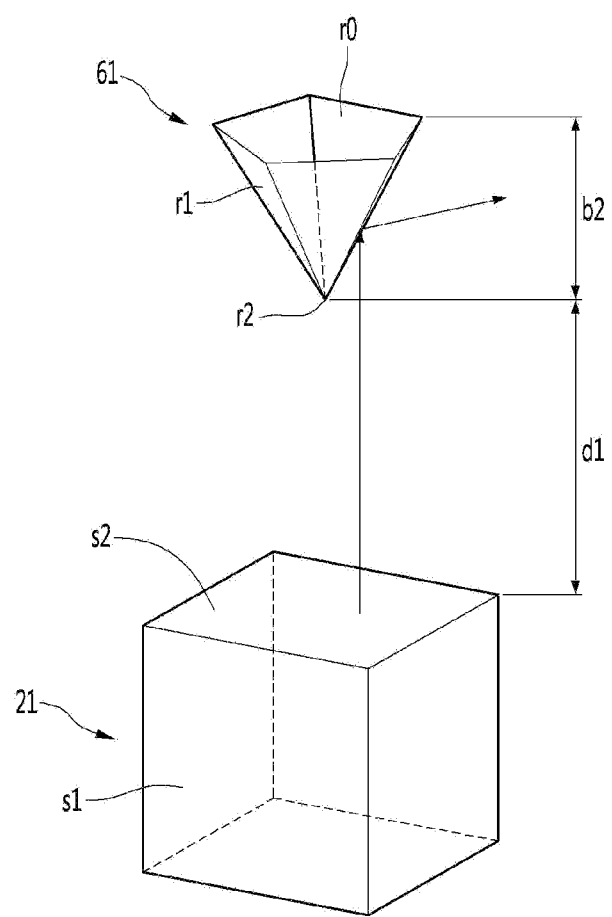
Figure 9:
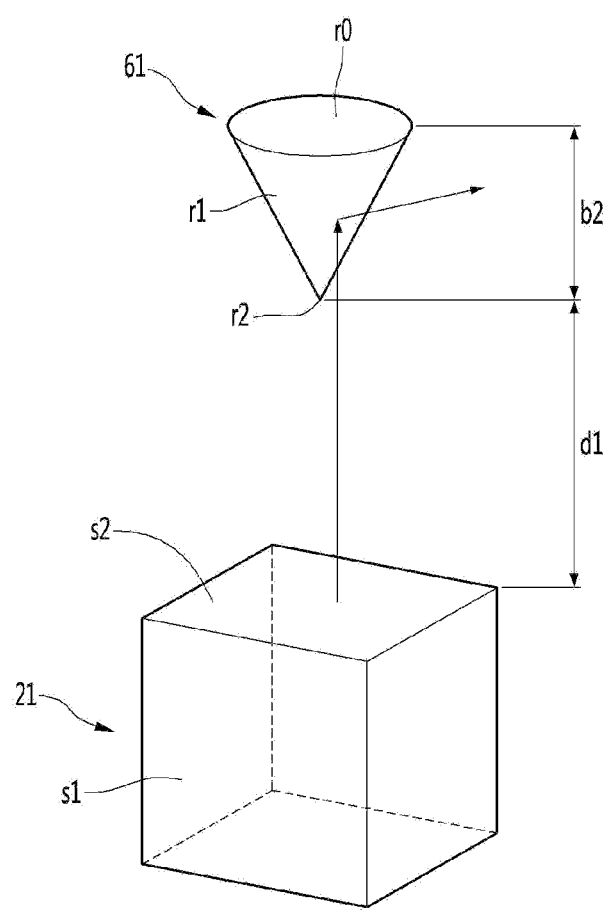

As shown in FIGS. 4 and 5, the recess portion 61 has an inverted polygonal pyramid shape, and the inverted polygonal pyramid shape may have a square cone shape. As another example, the recess portion 61 as shown in FIG. 7 may have a triangular pyramid shape, a pentagonal pyramid shape as shown in FIG. 8, or an inverted cone shape as shown in FIG. 9. That is, when the recess portion 61 has a polygonal pyramid shape, the side surface r1 of the recess portion 61 may be larger or smaller than the number of side surfaces s1 of the light emitting device 21. When the recess portion 61 has a polygonal side surface r1, a directivity characteristic for reflected light may be provided, and in the case of a cone shape, it may be reflected in all directions. Since the inner portion r0 of the recess portion 61 is provided as a concave empty space, light incident due to a difference in refractive index from the resin layer 41 may be refracted or reflected. The shape of the inner portion r0 of the recess portion 61 may be a polygonal cone shape or a conical shape.

Each side surface r1 of the recess portion 61 may be disposed in the same direction as each side surface s1 of the light emitting device 21. The edge between each side surface r1 of the recess portion 61 may be disposed at a position corresponding to the edge between each side surface s1 of the light emitting device 21. The edge of the upper surface of the recess portion 61 and the edge of the upper surface of the light emitting device 21 may extend or be disposed in the same direction. When the upper surface area of the recess portion 61 is less than 100% of the upper surface area of the light emitting device 21, for example, in a range of 50% to 99%, each side surface r1 of the recess portion 61 may overlap the upper surface of the light emitting device 21 in a vertical direction. The recess portion 61 may have an inclination angle c1 of the side surface r1 of 40 degrees or more, for example, in a range of 40 to 50 degrees. Accordingly, light directed upward through the upper surface of the light emitting device 21 may be effectively reflected by each side surface r1 of the recess portion 61.

FIG. 5 is a case in which the upper surface area of the recess portion 61 is smaller than the upper surface area of the light emitting device 21 in the lighting module of the invention. Here, the interval a3 between the light emitting devices 21 may be smaller than the interval a2 between the recess portions 61. When the interval a3 between the light emitting devices 21 is the same in the first direction and the second direction, a relationship a2>a3 may be obtained in the first direction and the second direction. The upper surface width b1 of the recess portion 61 may be smaller than the upper surface width b0 of the light emitting device 21 in the first direction. The interval a2 between the recess portions 61 may be smaller than the pitch a1, which is an interval between the centers of the light emitting devices 21. Each side surface r1 of the recess portion 61 may reflect the incident light as light diffused with respect to the side surface of the light emitting device 21.

Figure 6:
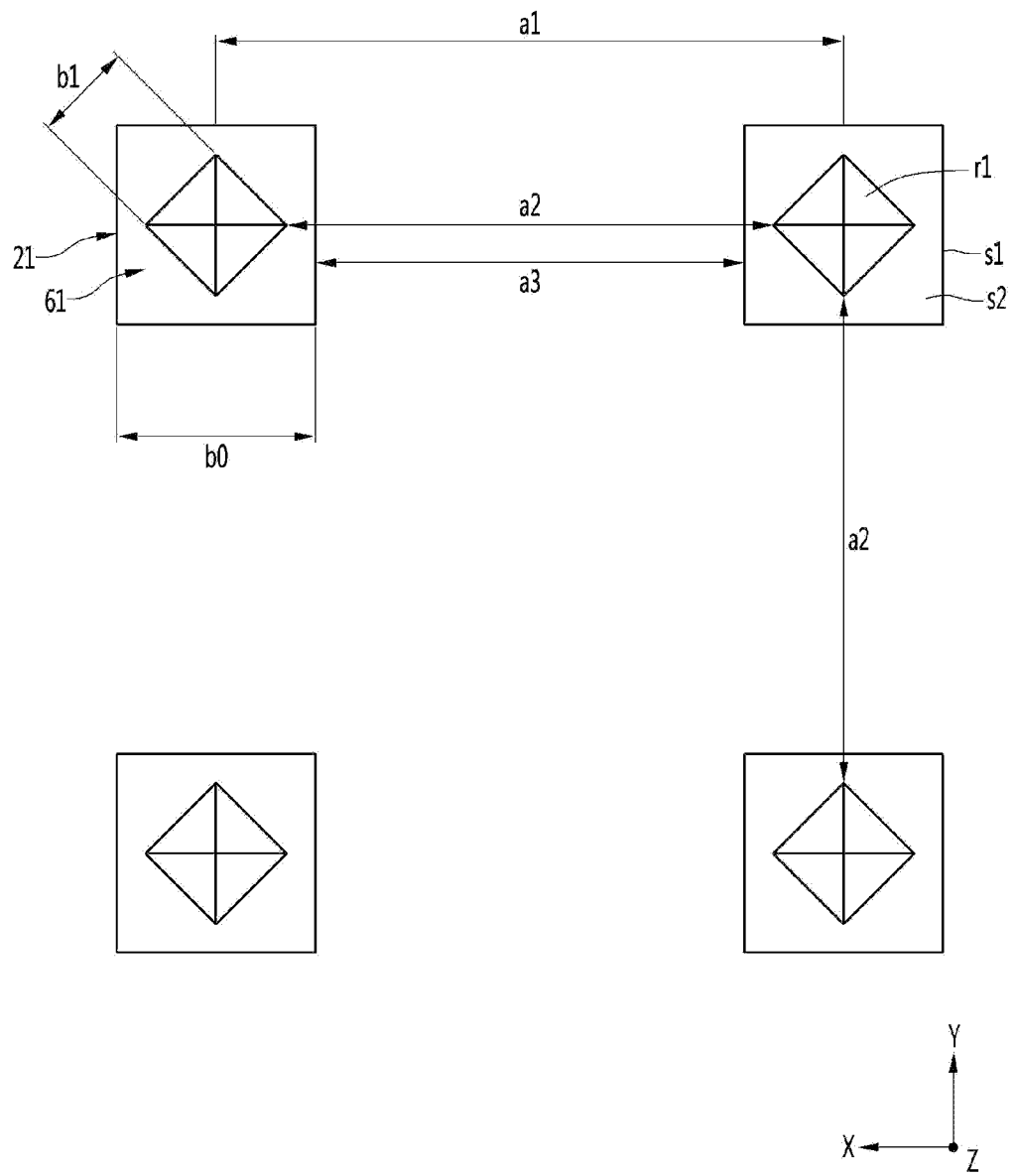
FIG. 6 is a view showing another example of a light emitting device and a recess portion in FIG. 1.
Figure 18:
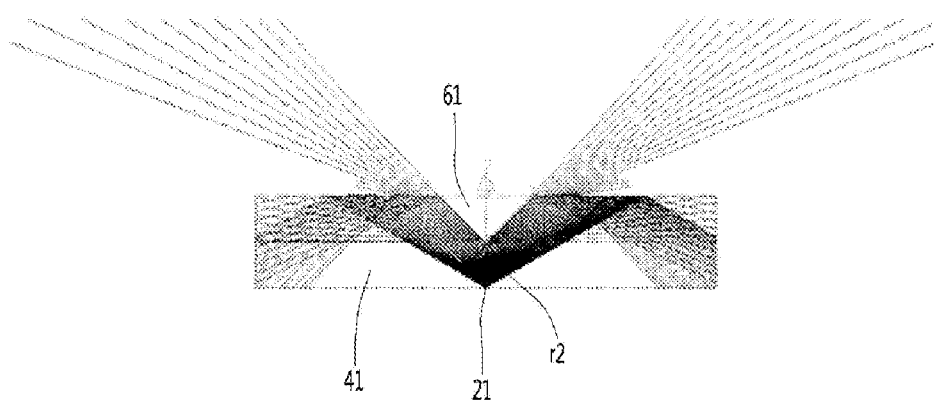
FIG. 18 is a diagram illustrating an optical path in a recess portion of a resin layer according to an embodiment of the invention.

FIG. 6, each side surface r1 or a center thereof of the recess portion 61 may correspond to a direction of an edge between side surfaces of the light emitting device 21. Conversely, a corner portion between each side surface r1 of the recess portion 61 may correspond to a center portion of each side surface of the light emitting device 21. Accordingly, the recess portion 61 may reflect light from two adjacent side surfaces r1 to the top of the light emitting device 21 in different directions. As shown in FIG. 18, the light reflected through the side surface r1 of the recess portion 61 may be emitted through the upper surface of the resin layer 41 or may be re-reflected from the upper surface of the resin layer 41. Accordingly, hot spots on the recess portion 61 may be suppressed.

Figure 19A:
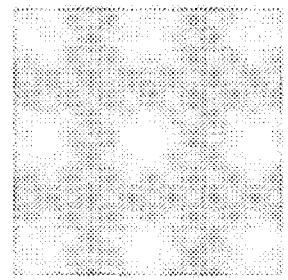
FIGS. 19A, 19B, and 19C are examples of luminance distribution according to a size of a recess portion compared to a light emitting device according to an embodiment of the invention.
Figure 19B:
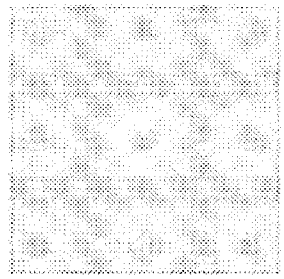
Figure 19C:
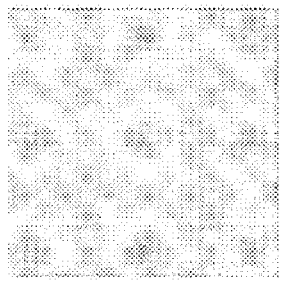

FIG. 19 is a diagram illustrating a luminance distribution according to a size of a recess portion in a lighting module according to an embodiment of the invention. (a) of FIG. 19 shows the case where the upper surface area of the recess portion is the same as the upper surface area of the light emitting device, (b) of FIG. 19 shows the case where the upper surface area of the recess portion is 200% of the upper surface area of the light emitting device, and (c) of FIG. 19 shows the case where the upper surface area of the recess portion is 400% of the upper surface area of the light emitting device. As shown in (a) of FIG. 19, when the upper surface area of the recess portion is the same as the size of the light emitting device, it may be seen that hot spots or dark portions on the light emitting device are suppressed. As shown in (b)(c) of FIG. 19, since the upper surface area of the recess portion is more than twice the size of the light emitting device, it may be seen that dark portions are generated on the light emitting device. Accordingly, in the embodiment of the invention, the upper surface area of the recess portion is provided in the range of 50% to 150% of the upper surface area of the light emitting device, thereby reducing the occurrence of dark portions or hot spots on the light emitting device.

Figure 10:
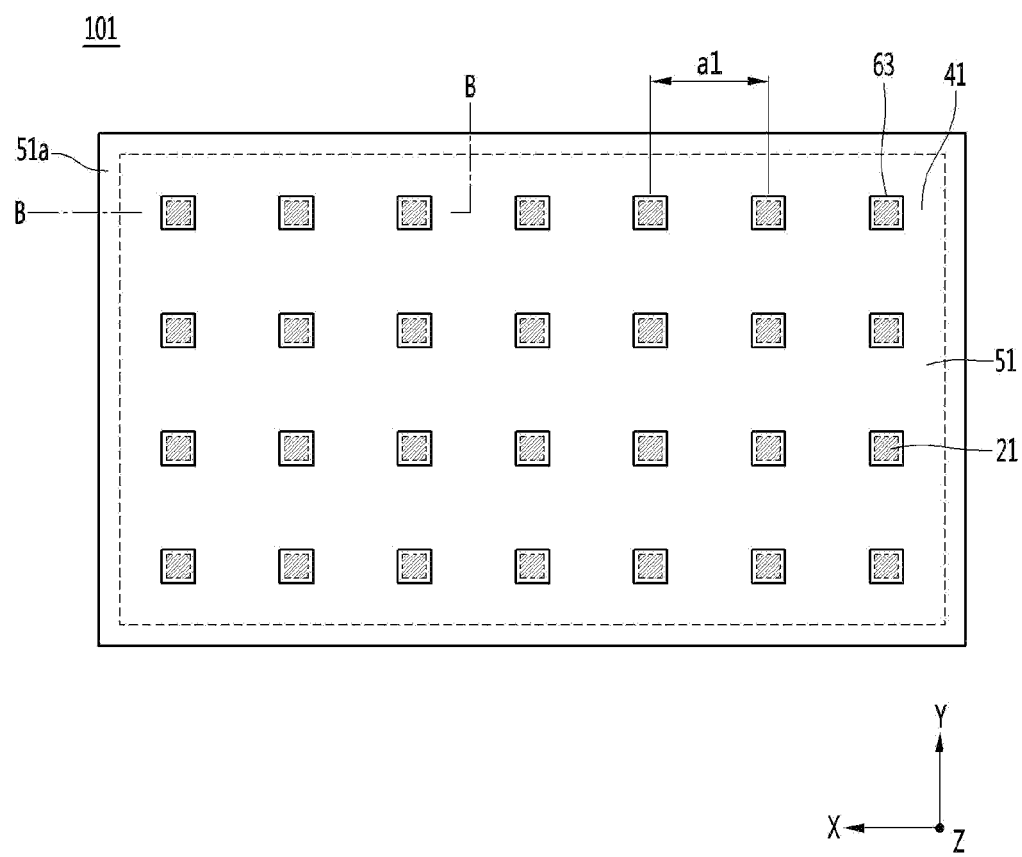
FIG. 10 is another example of the lighting module of FIG. 1.
Figure 11:
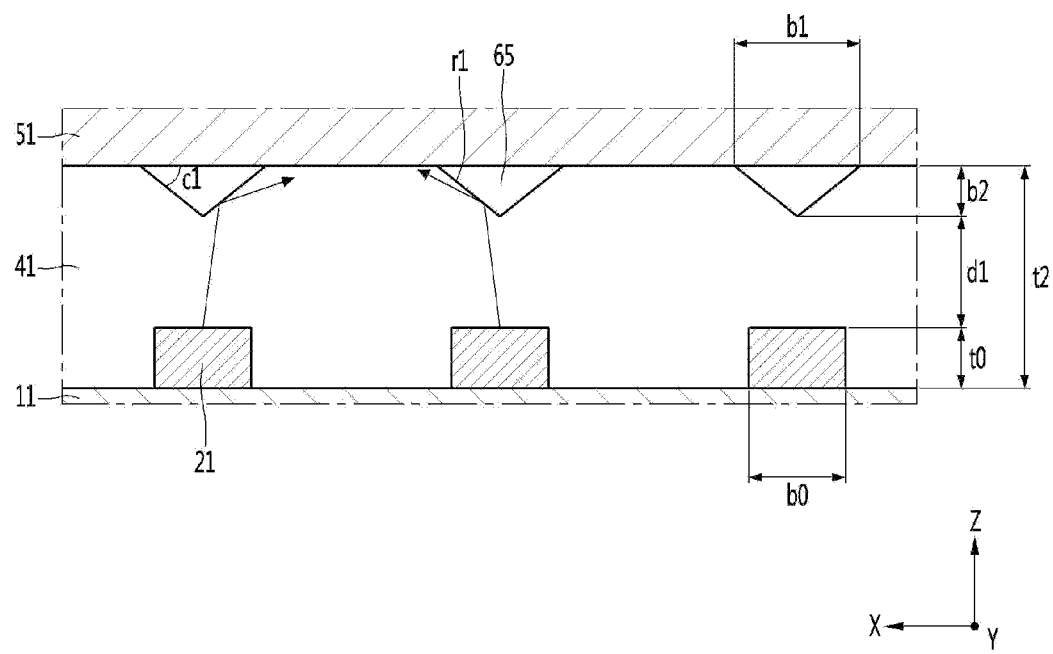
FIG. 11 is a cross-sectional view of a B-B side of the lighting module of FIG. 10.
Figure 12:
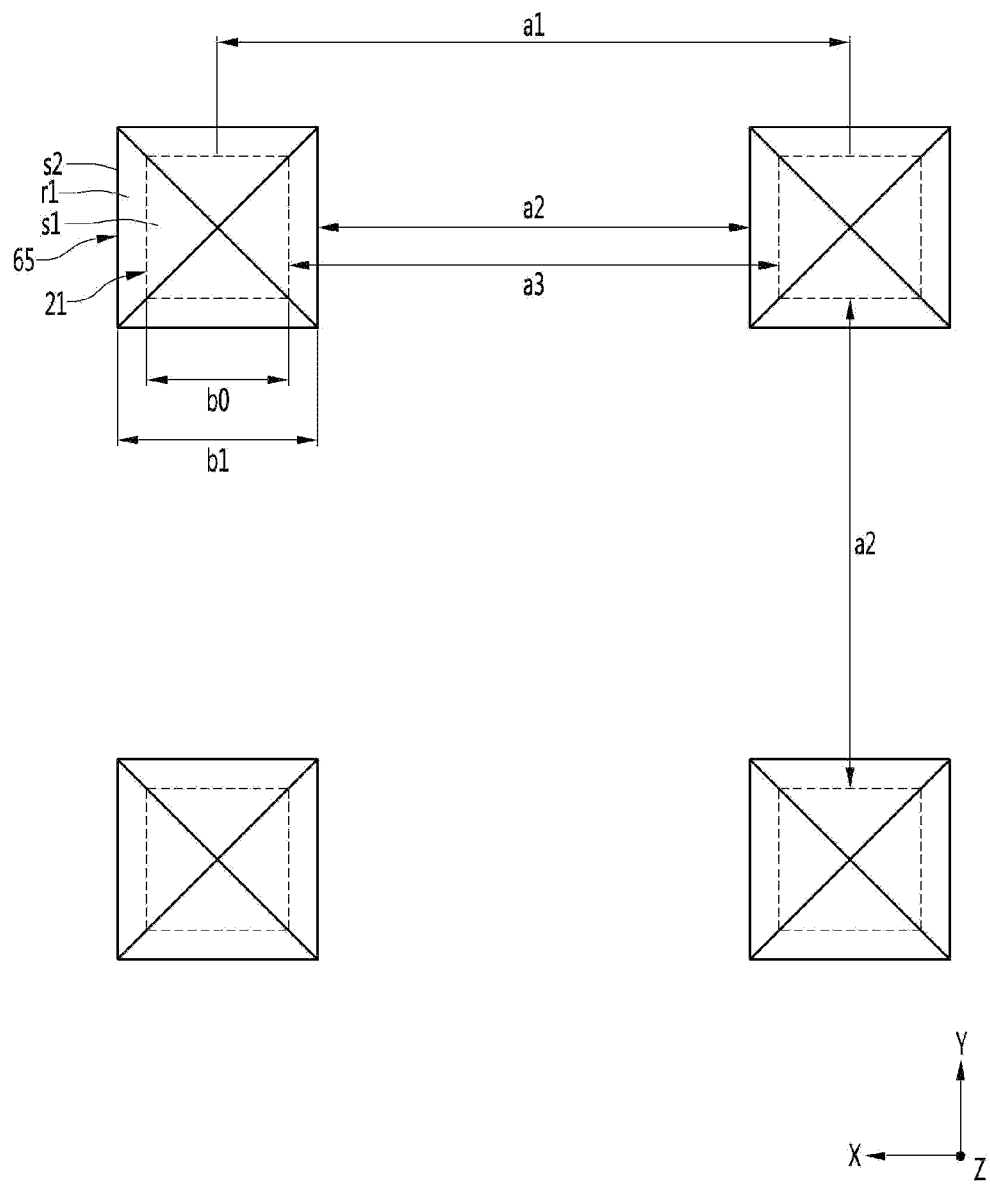
FIG. 12 is an example of an arrangement of a light emitting device and a recess portion of the lighting module of FIG. 10.

FIGS. 10 to 12 are other examples of a lighting module according to an embodiment of the invention. FIGS. 10 to 12 illustrate a case in which the upper surface area of the recess portion 65 is larger than the upper surface area of the light emitting device 21. The upper surface area of the recess portion 65 may range from 101% to 150% of the upper surface area of the light emitting device 21. The upper surface width b1 of the recess portion 65 may be larger than the upper surface width b0 of the light emitting device 21. The recess portion 65 may have an inclination angle c1 of the side surface r1 of 40 degrees or less, for example, in a range of 30 degrees to 40 degrees. The interval a3 between the light emitting devices 21 may be larger than the interval a2 between the recess portions 65. When the interval a3 between the light emitting devices 21 is the same in the first and second directions, a relationship a3>a2 may be obtained in the first and second directions. At this time, the upper surface width b1 of the recess portion 65 may be greater than the upper surface width b0 of the light emitting device 21 in the first direction. The interval a2 between the recess portions 65 may be smaller than the pitch a1, which is an interval between the centers of the light emitting devices 21. Each side surface r1 of the recess portion 65 may reflect the incident light into a region wider than that of each side surface s2 of the light emitting device 21. The edge between each side surface r1 of the recess portion 65 corresponds to the edge between each side surface s2 of the light emitting device 21, or may be tilted or shifted in a range of 1 degree to 90 degrees based on the edge of the light emitting device 21. In an embodiment of the invention, since each side surface r1 of the recess portion 65 extends more outward than the side surface s2 of the light emitting device 21 based on the center of the upper surface of the light emitting device 21, light traveling in a vertical upward direction through the light emitting device 21 may be reflected in a lateral direction. Accordingly, it is possible to provide a wider pitch between the light emitting devices 21.

Figure 13:
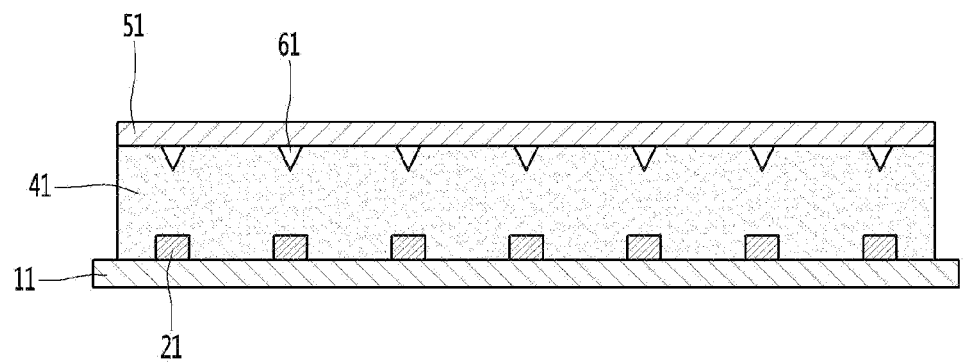
FIG. 13 is another example of the lighting module of FIG. 2.

As shown in FIG. 13, the side portion 51a of the phosphor layer 51 may be removed. In this case, a side surface of the resin layer 41 may be exposed from the phosphor layer 51. At least one or two or more of the side surfaces of the resin layer 41 may be exposed from the phosphor layer 51. The lower surface area of the resin layer 41 may be smaller than the upper surface area of the substrate 11, and a circumference of the upper surface of the substrate 11 may be exposed from the resin layer 41.

Figure 14:
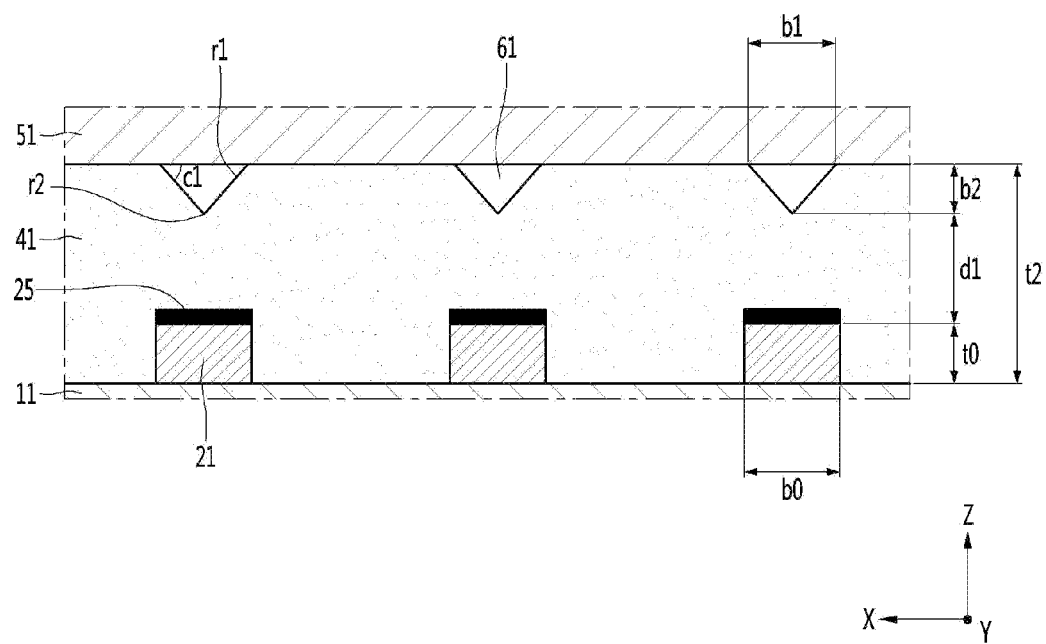
FIG. 14 is a first modified example of the lighting module of FIG. 2.

FIG. 14 is a first modified example of the lighting module of FIGS. 2 and 3. Referring to FIG. 14, a light shielding portion 25 may be disposed on the light emitting device 21. The light shielding portion 25 may include a phosphor or a diffusion agent therein. The light shielding portion 25 may be formed of a resin material such as silicone or epoxy. The phosphor may include at least one of blue, green, red, or yellow phosphors. The phosphor may be the same type as the phosphor added to the phosphor layer 51 or may be a red, green, or yellow phosphor. The diffusion agent may include at least one of PMMA (Poly Methyl Meth Acrylate) series, $TiO_2$, $SiO_2$, $Al_2O_3$, and silicon series. The light shielding portion 25 may be, for example, added with a diffusion agent. The light shielding portion 25 may be formed in an area equal to or larger than the upper surface of the light emitting device 21. Accordingly, the light shielding portion 25 may partially block light traveling to the upper surface of the light emitting device 21. The light shielding portion 25 is a white reflective material and may reduce transmittance of incident light. The light shielding portion 25 may be attached to the upper surface of the light emitting device 21. The light shielding portion 25 may be disposed between the light emitting device 21 and the resin layer 41. The light shielding portion 25 may overlap the recess portion 61 on the resin layer 41 in a vertical direction. Since the light shielding portion 25 and the recess portion 61 overlap the light emitting device 21 in a vertical direction, hot spots may be prevented. Since the light shielding portion 25 is disposed on the light emitting device 21, the recess portion 61 may be disposed in a range of 50% to 100% of the upper surface area of the light emitting device 21. The recess portion 61 may be disposed in a range of 50% to 100% of the upper surface area of the light shielding portion 25. When the recess portion 61 is smaller than the above range, a ring-shaped hot spot may occur, and when the recess portion 61 is larger than the above range, a dark portion may be generated.

Figure 15:
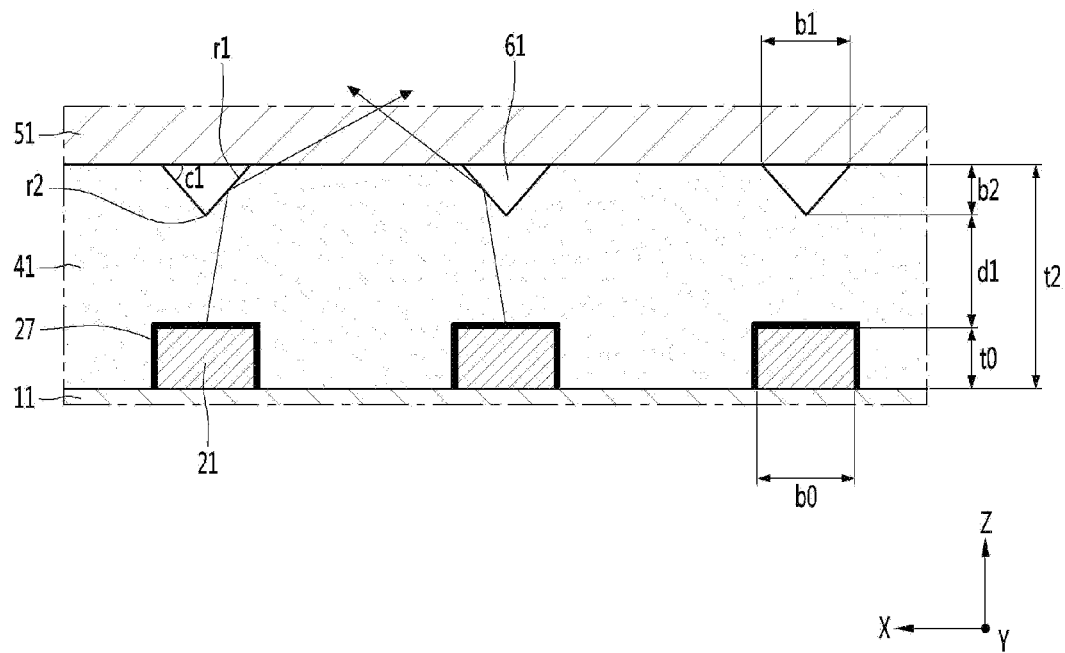
FIG. 15 is a second modified example of the lighting module of FIG. 2.

FIG. 15 is a second modified example of the lighting module of FIGS. 2 and 3. Referring to FIG. 15, a phosphor portion 27 may be disposed on the light emitting device 21. The phosphor portion 27 may include a phosphor therein. The phosphor portion 27 may be formed of a resin material such as silicone or epoxy. The phosphor may include at least one of blue, green, red, or yellow phosphors. The phosphor may be the same type as the phosphor added to the phosphor layer 51 or may be a red, green, or yellow phosphor. The phosphor portion 27 may be disposed on an upper surface of the light emitting device 21 or may be disposed on an upper surface and a side surface of the light emitting device 21. The phosphor portion 27 converts the light emitted from the light emitting device 21 to wavelength. The phosphor content of the phosphor portion 27 may be smaller than that of the phosphor added to the phosphor layer 51. This suppresses a decrease in luminous intensity caused by the phosphor portion 27 to prevent a decrease in luminous intensity of light converted by wavelength through the phosphor layer 51. The phosphor portion 27 may be disposed between the light emitting device 21 and the resin layer 41. The phosphor portion 27 may be vertically overlapped with the recess portion 61 on the resin layer 41. Since the phosphor portion 27 and the recess portion 61 overlap the light emitting device 21 in a vertical direction, hot spots may be prevented. The upper surface area of the phosphor portion 27 may be larger than the upper surface area of the light emitting device 21. Accordingly, since the phosphor portion 27 is disposed on the light emitting device 21, the recess portion 61 may be disposed in a range of 50% to 100% of the upper surface area of the light emitting device 21. The recess portion 61 may be disposed in a range of 40% to 90% of the upper surface area of the phosphor portion 27. When the recess portion 61 is smaller than the above range, a ring-shaped hot spot may occur, and when the recess portion 61 is larger than the above range, a dark portion may occur.

Figure 16:
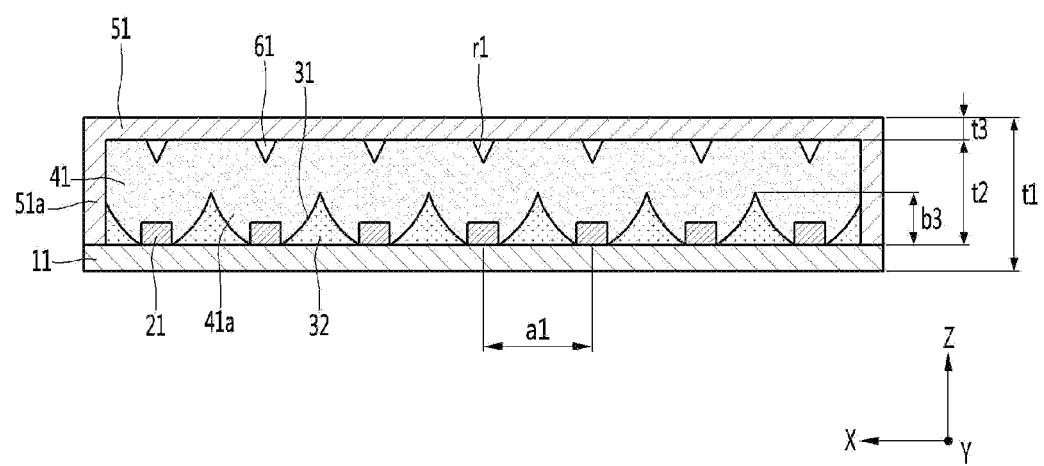
FIG. 16 is a third modified example of the lighting module of FIG. 2.
Figure 17:
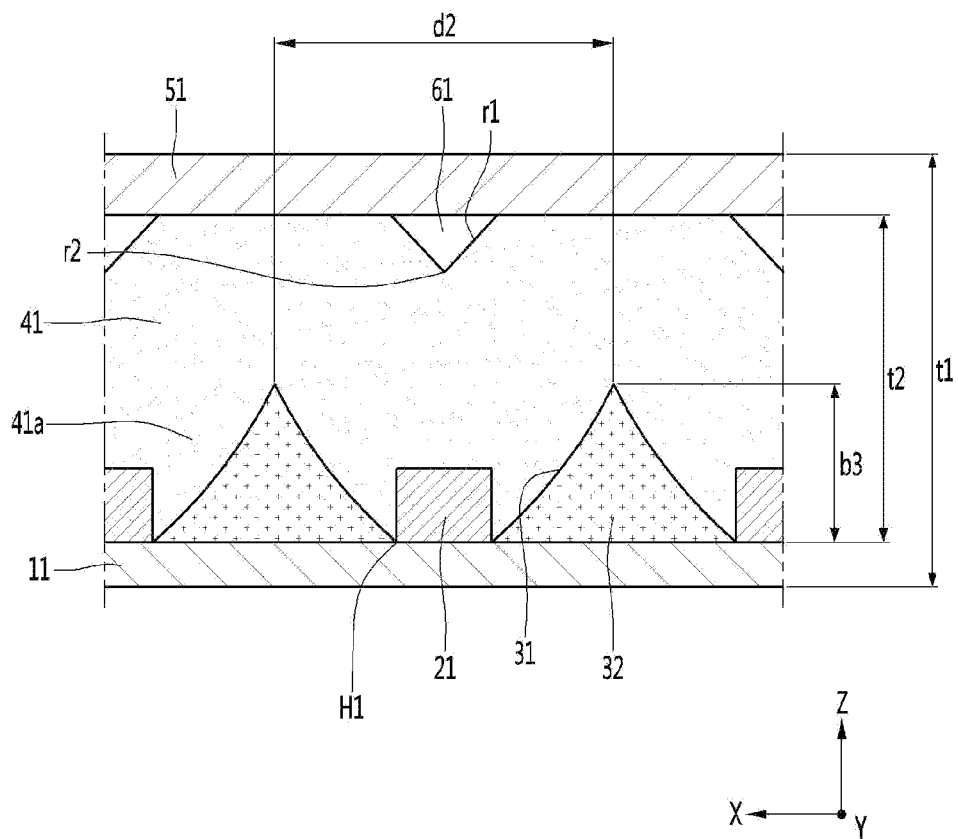
FIG. 17 is a partially enlarged view of the lighting module of FIG. 16.

FIG. 16 is a fourth modified example of the lighting module of FIG. 2, and FIG. 17 is a partially enlarged view of the lighting module of FIG. 16. The lighting module having the above reflective member may be applied to the above embodiment or a modified example having a light shielding portion or a phosphor portion.

Referring to FIGS. 16 and 17, in the lighting module, a reflective member 31 may be disposed between the substrate 11 and the resin layer 41. The reflective member 31 may not overlap the light emitting device 21 in a vertical direction. The reflective member 31 may overlap the resin layer 41 in a vertical direction. The height or thickness of the reflective member 31 may decrease or decrease from the center region toward the edge. The height of the surface of the reflective member 31 may gradually decrease as the distance from the recess portion 61 increases. The surface height of the reflective member 31 may increase as the distance from the light emitting devices 21 increases. The height of the surface of the reflective member 31 may be increased as it is closer to the center between the recess portions 61. The reflective member 31 may be adhered to the upper surface of the substrate 11 with an adhesive or may be directly adhered. The reflective member 31 may be a reflective sheet or may include a reflective resin. The reflective member 31 may be formed of a resin body 32 containing silicone or epoxy, or a filler having a high refractive index, a reflective agent, or an absorbent may be added therein. The filler may include at least one of PMMA (Poly Methyl Meth Acrylate) series, $TiO_2$, $SiO_2$, $Al_2O_3$, and silicon series. The filler has a refractive index in the range of 1.4 to 2 at the emission wavelength, and the size may be in the range of 4 μm to 6 μm. The surface color of the reflective member 31 may be white. As another example, the reflective member 31 may be provided as an absorbing member, and the absorbing member may include a filler such as graphite in a resin material such as silicon or epoxy. Such an absorbing member absorbs light around the light emitting device, thereby preventing unnecessary light interference. For explanation of the invention, the reflective member 31 will be described as an example. The resin layer 41 seals the reflective member 31.

The resin layer 41 may contact the surface of the reflective member 31. The lower portion 41a of the resin layer 41 may protrude into the reflective member 31. The lower portion 41a of the resin layer 41 may be disposed between the reflective member 31 and the light emitting device 21. The lower portion 41a of the resin layer 41 may contact the upper surface of the substrate 11 through a region between the reflective member 31 and the light emitting device 21. The upper surface of the resin layer 41 may be disposed higher than the upper end of the reflective member 31.

As shown in FIG. 17, the reflective member 31 may include a through hole H1 into which the light emitting devices 21 are inserted. Although one light emitting device is inserted into each of the through holes H1, two or three or more light emitting devices may be inserted. That is, one or two or more light emitting devices may be disposed in one through hole H1. The shape of the through hole H1 may be a circular shape or a polygonal shape. The reflective member 31 may be disposed around each of the plurality of light emitting devices 21. The reflective member 31 may cover the circumference of each of the light emitting devices 21 to reflect incident light. The height or thickness b3 of the reflective member 31 may be greater than the height or thickness of the light emitting device 21 with respect to the upper surface of the substrate 11. The reflective member 31 may include a concave inclined surface or a curved surface having a gradually lower height as it is adjacent to the light emitting device 21. Accordingly, the reflective member 31 reflects the light incident from the light emitting device 21 toward an upper portion of the light emitting device 21, and the intensity of the light on the light emitting device 21 may be increased.

The thickness b3 of the reflective member 31 may be thicker than the thickness of the light emitting device 21 and smaller than the thickness t2 of the resin layer 41. The upper end of the reflective member 31 may be higher than the upper surface of the light emitting device 21 and lower than the upper surface of the resin layer 41. The thickness b3 of the reflective member 31 may be at least 0.4 times the thickness t2 of the resin layer 41, for example, in the range of 0.4 times to 0.6 times. Since the thickness b3 of the reflective member 31 is disposed within the above range, light reflection efficiency may be improved and light intensity may be increased. When the thickness b3 of the reflective member 31 is smaller than the above range, the light reflection efficiency may decrease or the light intensity may decrease, and when the thickness b3 of the reflective member 31 is larger than the above range, the orientation angle may become 40 degrees or less or a dark portion may occur. The distance d2 between the upper ends of the reflective members 31 or the diameter of the recess or cavity formed by the reflective members 31 may be the same as the pitch of the light emitting device 21.

The upper portion of the reflective member 31 may gradually increase as it closer to the resin layer 41 in the region between the light emitting devices 21. The reflective member 31 may be formed of a reflective resin, or a reflective resin layer may be laminated on the surface of a body made of a transparent resin material. Alternatively, the reflective member 31 may be formed as a metal or non-metallic reflective layer on the surface of the body made of epoxy or silicone resin. The recess portion 61 according to an embodiment of the invention may not overlap the reflective member 31 in a vertical direction above the resin layer 41. When the upper surface area of the recess portion 61 is larger than the upper surface area of the light emitting device 21, the upper portion of the side surface r1 of the recess portion 61 may be overlapped with the lower portion of the reflective member 31 in a vertical direction. The recessed portion 61 may reflect the light proceeding upward from the light emitting device 21 or the light reflected by the reflective member 31, thereby suppressing hot spots on the light emitting device 21.

Figure 20:
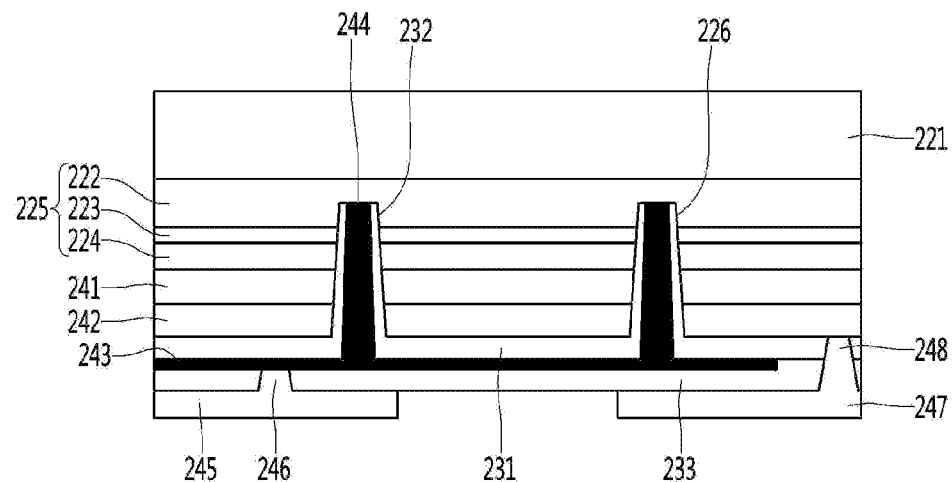
FIG. 20 is an example of a light emitting device of a lighting module according to an embodiment of the invention.

FIG. 20 is a diagram showing an example of a light emitting device of a lighting module according to an embodiment of the invention. Referring to FIG. 20, the light emitting device disclosed in the embodiment includes a light emitting structure 225 and a plurality of electrodes 245 and 247. The light emitting structure 225 may be formed of a compound semiconductor layer of a group II to VI element, for example, a compound semiconductor layer of a group III-V element or a compound semiconductor layer of a group II-VI element. The plurality of electrodes 245 and 247 are selectively connected to the semiconductor layer of the light emitting structure 225 and supply power.

The light emitting device may include a substrate 221. The substrate 221 is disposed on the light emitting structure 225. The substrate 221 may be, for example, a translucent, insulating substrate, or a conductive substrate. The substrate 221 may be, for example, at least one of sapphire ($Al_2O_3$), SiC, Si, GaAs, GaN, ZnO, Si, GaP, InP, Ge, and $Ga_2O_3$. A plurality of convex portions (not shown) are formed on at least one or both of the top surface and the bottom surface of the substrate 221, thereby improving light extraction efficiency. The side cross-sectional shape of each convex portion may include at least one of a hemispherical shape, a semi-elliptic shape, or a polygonal shape. The substrate 221 may be removed, but is not limited thereto. At least one of a buffer layer (not shown) and a low conductivity semiconductor layer (not shown) may be included between the substrate 221 and the light emitting structure 225. The buffer layer is a layer for reducing a difference in lattice constant between the substrate 221 and the semiconductor layer, and may be selectively formed from group II to group VI compound semiconductors. An undoped Group III-V compound semiconductor layer may be further formed under the buffer layer, but the embodiment is not limited thereto. The light emitting structure 225 may be disposed under the substrate 221, and includes a first conductive type semiconductor layer 222, an active layer 223, and a second conductive type semiconductor layer 224. Another semiconductor layer may be further disposed on at least one of the top and bottom of each of the layers 222, 223, and 224, but the embodiment is not limited thereto. The first conductive type semiconductor layer 222 is disposed under the substrate 221 and may be implemented as a semiconductor doped with a first conductive type dopant, for example, an n-type semiconductor layer. The first conductive semiconductor layer 222 includes a composition formula of $In_xAl_yGa_{1-x-y}N$ (0≤x≤1, 1≤y≤1, 0≤x+y≤1). The first conductive type semiconductor layer 222 may be selected from a compound semiconductor of a group III-V element, such as GaN, AlN, AlGaN, InGaN, InN, InAlGaN, AlInN, AlGaAs, GaP, GaAs, GaAsP, and AlGaInP. The first conductive type dopant is an n-type dopant and includes a dopant such as Si, Ge, Sn, Se, and Te. The active layer 223 is disposed under the first conductive type semiconductor layer 222 and optionally includes a single quantum well, a multiple quantum well (MQW), a quantum wire structure, or a quantum dot structure, and includes a cycle of the well layer and the barrier layer. The cycle of the well layer/barrier layer is, for example, at least one of pairs of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs. The second conductive type semiconductor layer 224 is disposed under the active layer 223. The second conductive type semiconductor layer 224 includes a semiconductor doped with a second conductive type dopant, for example, the compositional formula of $In_xAl_yGa_{1-x-y}N$ (0≤x≤1, 1≤y≤1, 0≤x+y≤1). The second conductive type semiconductor layer 224 may be formed of at least one of compound semiconductors such as GaN, InN, AlN, InGaN, AlGaN, InAlGaN, AlInN, AlGaAs, GaP, GaAs, GaAsP, and AlGaInP. The second conductive type semiconductor layer 224 is a p-type semiconductor layer, and the first conductive dopant is a p-type dopant, and may include Mg, Zn, Ca, Sr, and B a. As another example of the light emitting structure 225, the first conductive type semiconductor layer 222 may be implemented as a p-type semiconductor layer, and the second conductive type semiconductor layer 224 may be implemented as an n-type semiconductor layer. A third conductive type semiconductor layer having a polarity opposite to that of the second conductive type may be formed under the second conductive type semiconductor layer 224. In addition, the light emitting structure 225 may be implemented in any one of an n-p junction structure, a p-n junction structure, an n-p-n junction structure, and a p-n-p junction structure.

First and second electrodes 245 and 247 are disposed under the light emitting structure 225. The first electrode 245 is electrically connected to the first conductive type semiconductor layer 222, and the second electrode 247 is electrically connected to the second conductive type semiconductor layer 224. The first and second electrodes 245 and 247 may have a polygonal or circular bottom shape. A plurality of recess portions 226 may be provided in the light emitting structure 225. The light emitting device includes first and second electrode layers 241 and 242, third electrode layers 243, and insulating layers 231 and 233. Each of the first and second electrode layers 241 and 242 may be formed as a single layer or multiple layers, and may function as a current diffusion layer. The first and second electrode layers 241 and 242 may include a first electrode layer 241 disposed under the light emitting structure 225, and a second electrode layer 242 disposed under the first electrode layer 241. The first electrode layer 241 diffuses current, and the second electrode layer 241 reflects incident light. The first and second electrode layers 241 and 242 may be formed of different materials. The first electrode layer 241 may be formed of a translucent material, for example, a metal oxide or a metal nitride. The first electrode layer 241 may be selectively formed among, for example, indium tin oxide (ITO), ITON (ITO nitride), IZO (indium zinc oxide), IZON (IZO nitride), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide). The second electrode layer 242 is in contact with a lower surface of the first electrode layer 241 and may function as a reflective electrode layer. The second electrode layer 242 includes a metal such as Ag, Au, or Al. The second electrode layer 242 may partially contact the lower surface of the light emitting structure 225 when a portion of the first electrode layer 241 is removed. As another example, the structures of the first and second electrode layers 241 and 242 may be stacked in an omni-directional reflector layer (ODR) structure. The omni-directional reflective structure may be formed in a stacked structure of the first electrode layer 241 having a low refractive index and the second electrode layer 242 made of a highly reflective metal material in contact with the first electrode layer 241. The electrode layers 241 and 242 may have, for example, a stacked structure of ITO/Ag. The omni-directional reflection angle at the interface between the first electrode layer 241 and the second electrode layer 242 may be improved. As another example, the second electrode layer 242 may be removed, and may be formed of a reflective layer of a different material. The reflective layer may be formed in a distributed Bragg reflector (DBR) structure, and the distributed Bragg reflector structure includes a structure in which two dielectric layers having different refractive indices are alternately disposed, for example, it is different from a $SiO_2$ layer, Each of a $Si_3N_4$ layer, a $TiO_2$ layer, an $Al_2O_3$ layer, and an MgO layer and may include any one of them. As another example, the electrode layers 241 and 242 may include both a distributed Bragg reflective structure and an omni-directional reflective structure, and in this case, a light emitting device having a light reflectance of 98% or more may be provided. Since the light emitting device mounted in the flip method emits light reflected from the second electrode layer 242 through the substrate 221, most of the light may be emitted in a vertical direction. The light emitted to the side of the light emitting device may be reflected by the reflective member to the light exit area through the adhesive member according to the embodiment.

The third electrode layer 243 is disposed under the second electrode layer 242 and is electrically insulated from the first and second electrode layers 241 and 242. The third electrode layer 243 is formed of a metal such as at least one of titanium (Ti), copper (Cu), nickel (Ni), gold (Au), chromium (Cr), tantalum (Ta), platinum (Pt), tin (Sn), silver (Ag), and phosphorus (P). A first electrode 245 and a second electrode 247 are disposed under the third electrode layer 243. The insulating layers 231 and 233 block unnecessary contact between the first and second electrode layers 241 and 242, the third electrode layer 243, the first and second electrodes 245 and 247, and the layers of the light emitting structure 225. The insulating layers 231 and 233 include first and second insulating layers 231 and 233, and the first insulating layer 231 is disposed between the third electrode layer 243 and the second electrode layer 242. The second insulating layer 233 is disposed between the third electrode layer 243 and the first and second electrodes 245 and 247. The third electrode layer 243 is connected to the first conductive type semiconductor layer 222. The connection part 244 of the third electrode layer 243 protrudes in a via structure through the lower portions of the first and second electrode layers 241 and 242 and the light emitting structure 225 and contacts the first conductive type semiconductor layer 222 do. The connection part 244 may be disposed in plurality. A portion 232 of the first insulating layer 231 extends along the recess portion 226 of the light emitting structure 225 around the connection part 244 of the third electrode layer 243, and may block the electrically connections of the third electrode layer 243 and the first and second electrode layers 241 and 242, the second conductive type semiconductor layer 224 and the active layer 223 from each other. An insulating layer may be disposed on the side surface of the light emitting structure 225 to protect the side surface, but is not limited thereto. The second electrode 247 is disposed under the second insulating layer 233 and contacts at least one of the first and second electrode layers 241 and 242 through the open region of the second insulating layer 233 or connected. The first electrode 245 is disposed under the second insulating layer 233 and is connected to the third electrode layer 243 through an open region of the second insulating layer 233. Accordingly, the protrusion 248 of the second electrode 247 is electrically connected to the second conductive type semiconductor layer 224 through the first and second electrode layers 241 and 242, and the protrusion 246 of the first electrode 245 may be electrically connected to the first conductive type semiconductor layer 222 through the third electrode layer 243.

Figure 21:
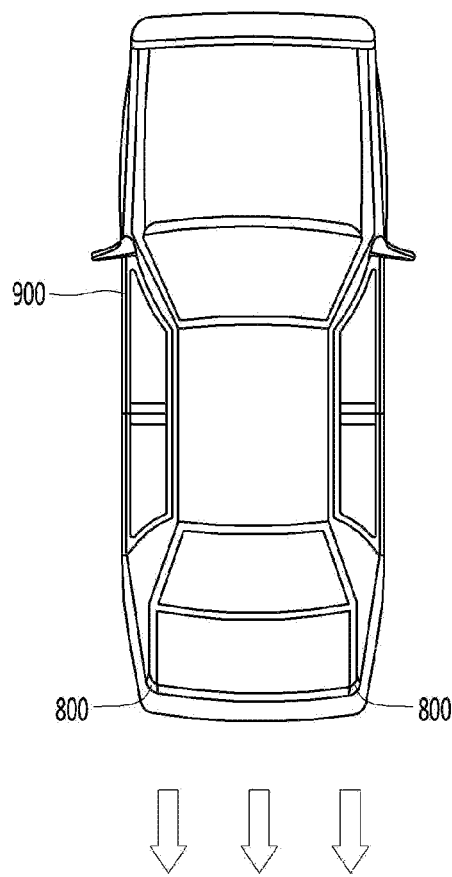
FIG. 21 is a plan view of a vehicle to which a lamp having a lighting module according to an embodiment of the invention is applied.
Figure 22:
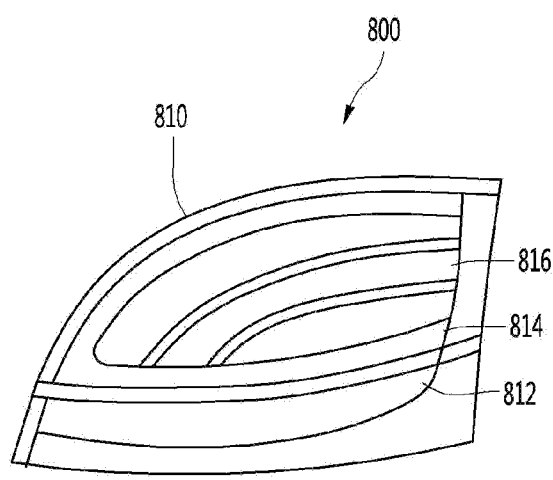
FIG. 22 is a view showing a lamp having a lighting module or lighting device according to an embodiment of the invention.

FIG. 21 is a plan view of a vehicle to which a vehicle lamp to which a lighting module is applied according to an embodiment is applied, and FIG. 22 is a view illustrating a vehicle lamp having a lighting module or a lighting device disclosed in the embodiment.

Referring to FIGS. 21 and 22, in the vehicle 900, the rear light 800 may include a first lamp unit 812, a second lamp unit 814, a third lamp unit 816, and a housing 810. Here, the first lamp unit 812 may be a light source for the role of a direction indicator, the second lamp unit 814 may be a light source for the role of a vehicle width lamp, and the third lamp unit 816 may be a light source for the role of a brake light, but is not limited thereto. At least one or all of the first to third lamp units 812, 814, and 816 may include the lighting module disclosed in the embodiment. The housing 810 accommodates the first to third lamp units 812, 814, and 816, and may be made of a light-transmitting material. At this time, the housing 810 may have a curvature according to the design of the vehicle body, and the first to third lamp units 812, 814, and 816 may implement a surface light source that may have a curved surface according to the shape of the housing 810. Such a vehicle lamp may be applied to a turn signal lamp of a vehicle when the lamp unit is applied to a tail lamp, a brake lamp, or a turn signal lamp of a vehicle.

Features, structures, effects, and the like described in the embodiments above are included in at least one embodiment of the invention, and are not necessarily limited to only one embodiment. Furthermore, the features, structures, effects, and the like illustrated in each embodiment may be combined or modified for other embodiments by a person having ordinary knowledge in the field to which the embodiments belong. Therefore, contents related to such combinations and modifications should be interpreted as being included in the scope of the invention.

In addition, although the embodiments have been described above, these are only examples and do not limit the invention, and those of ordinary skill in the field to which the invention belongs are illustrated above within the scope not departing from the essential characteristics of the present embodiment. It will be seen that various modifications and applications that are not available are possible. For example, each component specifically shown in the embodiment may be modified and implemented. And differences related to these modifications and applications should be construed as being included in the scope of the invention defined in the appended claims.

What is claimed is:

1. A lighting module comprising:
   a substrate;
   a plurality of light emitting devices disposed on the substrate, each of the light emitting devices includes an LED chip that emits light from a plurality of side surfaces and from an upper surface;
   a resin layer disposed on the substrate and the plurality of light emitting devices;
   a phosphor layer disposed on the resin layer, the phosphor layer including a top portion disposed on an upper surface of the resin layer and a plurality of side portions on all outer side surfaces of the resin layer such that the resin layer is surrounded by the plurality of side portions, wherein each of the side portions separately contacts an upper surface of the substrate; and a plurality of recess portions overlapping each of the light emitting devices in a vertical direction, wherein a total number of the plurality of recess portions is same as a total number of the light emitting devices, and an edge between two side surfaces of the recess portion corresponds to an edge between two side surfaces of the light emitting device that vertically overlap the recess portion, wherein an upper surface area of each separate one of the recess portions is within a range of 101% to 150% of an upper surface area of a separate corresponding one of the light emitting devices that is vertically overlapped by the recess portion, wherein each of the recess portions is formed to be concave toward a corresponding one of the light emitting devices on the upper surface of the resin layer and includes an inclined side surface which is lower than the upper surface of the resin layer, wherein a pitch between two of the light emitting devices is equal to or greater than a thickness of the resin layer in the vertical direction, and wherein a shortest distance between each of the light emitting devices and a corresponding one of the recess portions is within a range of 3 to 5 times a thickness of the light emitting device in the vertical direction, wherein a thickness of the top portion of the phosphor layer in the vertical direction is within a range of 15% to 25% of the thickness of the resin layer in the vertical direction.

2. The lighting module of claim 1, wherein an angle formed between a side surface of each of the recess portions and a horizontal upper surface of the resin layer is within a range of 30 degrees to 50 degrees.

3. The lighting module of claim 1, wherein each of the recess portions has an inverted cone or an inverted polygonal pyramid shape.

4. The lighting module of claim 1, wherein each of the recess portions is filled with air or comprises a material having a refractive index of 1.

5. The lighting module of claim 1, wherein each of the recess portions includes a vertex that is a lowermost point of the inclined side surface, wherein an inner angle formed by one side and the other side of each of the recess portions is 80 degrees to 120 degrees based on the vertex.

6. The lighting module of claim 1, wherein the phosphor layer includes a red phosphor, and at least one of the resin layer and the phosphor layer includes a diffusion agent.

7. The lighting module of claim 1, wherein an edge of an upper surface of each of the recess portions and an edge of an upper surface of each of the light emitting devices extend in a same direction.

8. The lighting module of claim 1, comprising a light shielding portion or a phosphor portion disposed between each of the light emitting devices and the resin layer.

9. The lighting module of claim 1, comprising a reflective member disposed between the substrate and the resin layer and disposed around each of the light emitting devices, and a height of the reflective member is lowered toward an edge from a center region between adjacent light emitting devices.

10. The lighting module of claim 9, wherein a high point of the reflective member is disposed higher than an upper surface of the light emitting device.

11. The lighting module of claim 9, wherein the reflective member is in contact with the phosphor layer disposed on the side surfaces of the resin layer.

12. The lighting module of claim 1, wherein an interval between the light emitting devices is smaller than an interval between the recess portions.

13. The lighting module of claim 1, wherein a linear distance from a lower surface of the substrate to an upper surface of the phosphor layer is in a range of 3 mm to 5 mm.

14. The lighting module of claim 1, wherein each of the plurality of recess portions is provided as an empty space between the resin layer and the phosphor layer.

15. A lighting module comprising:

a substrate;

a plurality of light emitting devices disposed on the substrate, each of the light emitting devices includes an LED chip that emits light from a plurality of side surfaces and from an upper surface;

a resin layer disposed on the substrate and the plurality of light emitting devices;

a phosphor layer disposed on an upper surface and side surfaces of the resin layer, the phosphor layer including a top portion disposed on the upper surface of the resin layer and a plurality of side portions on the side surfaces of the resin layer such that the resin layer is surrounded by the plurality of side portions, wherein each of the side portions separately contacts an upper surface of the substrate; and a plurality of recess portions overlapping each of the plurality of light emitting devices in a vertical direction, wherein a total number of the plurality of recess portions is same as a total number of the light emitting devices, and an edge between two side surfaces of the recess portion corresponds to an edge between two side surfaces of the light emitting device that vertically overlap the recess portion, wherein the resin layer is disposed on upper side and outer side of each of the plurality of light emitting devices, wherein an upper surface area of each separate one of the plurality of recess portions is within a range of 101% to 150% of an upper surface area of a separate corresponding one of the plurality of light emitting devices that is vertically overlapped by the recess portion, wherein each of the plurality of recess portions is formed to be concave toward a corresponding one of the plurality of light emitting devices on the upper surface of the resin layer, and includes an inclined side surface which is lower than the upper surface of the resin layer, wherein a pitch between two of the light emitting devices is equal to or greater than a thickness of the resin layer in the vertical direction, wherein a shortest distance between each of the plurality of light emitting devices and a corresponding one of the plurality of recess portions is within a range of 3 to 5 times a thickness of the light emitting device in the vertical direction, and wherein a linear distance from a lower surface of the substrate to an upper surface of the phosphor layer is within a range of 3 mm to 5 mm.

16. The lighting module of claim 15, wherein each of the plurality of recess portions is an empty space between the resin layer and the phosphor layer, wherein inside side surface of each of the plurality of recess portions is non-contact with the phosphor layer.

17. The lighting module of claim 15, wherein an angle formed between a side surface of each of the recess portions and a horizontal upper surface of the resin layer is within a range of 30 degrees to 50 degrees,
  wherein each of the recess portions includes an inverted cone or an inverted polygonal pyramid shape,
  wherein each of the recess portions includes a vertex that is a lowest point of the inclined side surface,
  wherein an inner angle formed by one side and the other side of the recess portion is 80 degrees to 120 degrees based on the vertex.

18. The lighting module of claim 15,
  wherein an interval between the light emitting devices is smaller than an interval between the recess portions.

19. The lighting module of claim 15, wherein the phosphor layer comprises a red phosphor, and the resin layer is provided without a diffusing agent, and
  wherein an edge of an upper surface of each of the recess portions and an edge of an upper surface of each of the light emitting devices extends in a same direction.

20. The lighting module of claim 15, wherein a thickness of the top portion of the phosphor layer in the vertical direction is within a range of 15% to 25% of the thickness of the resin layer in the vertical direction.

\* \* \* \* \*